(12) United States Patent
Nagata

(10) Patent No.: US 7,327,638 B2
(45) Date of Patent: Feb. 5, 2008

(54) ELECTRONIC TIMEPIECE

(75) Inventor: Yoichi Nagata, Tokorozawa (JP)

(73) Assignee: Citizen Holdings Co., Ltd., Tokyo (JP)

( * ) Notice: Subject to any disclaimer, the term of this patent is extended or adjusted under 35 U.S.C. 154(b) by 486 days.

(21) Appl. No.: 10/528,807

(22) PCT Filed: Sep. 24, 2003

(86) PCT No.: PCT/JP03/12145

§ 371 (c)(1),
(2), (4) Date: Mar. 23, 2005

(87) PCT Pub. No.: WO2004/029735

PCT Pub. Date: Apr. 8, 2004

(65) Prior Publication Data

US 2005/0243657 A1    Nov. 3, 2005

(30) Foreign Application Priority Data

Sep. 24, 2002  (JP) .............................. 2002-276572

(51) Int. Cl.
*G04B 1/00* (2006.01)
*G04B 9/00* (2006.01)
*G04C 23/00* (2006.01)
*G04C 3/00* (2006.01)

(52) U.S. Cl. ........................... 368/64; 368/66; 368/204

(58) Field of Classification Search ................. 368/64, 368/66, 203–205

See application file for complete search history.

(56) References Cited

U.S. PATENT DOCUMENTS 4,094,137 A * 6/1978 Morokawa .................. 368/200
4,653,931 A * 3/1987 Takeda ....................... 368/205
4,730,287 A * 3/1988 Yoshino et al. ............. 368/205
5,615,178 A * 3/1997 Takakura et al. ........... 368/203
5,740,132 A * 4/1998 Ohshima et al. ............ 368/204
6,301,198 B1 * 10/2001 Otaka et al. ................ 368/205
6,466,519 B1 * 10/2002 Nakamura et al. ........... 368/64
6,522,603 B1 * 2/2003 Miyahara et al. ........... 368/203

FOREIGN PATENT DOCUMENTS

| EP | 0 898 355 A2 | 2/1999 |
|----|---|---|
| JP | 56-025280 U | 3/1981 |
| JP | 57-045483 A | 3/1982 |
| JP | 07-008108 B2 | 1/1995 |
| JP | 07-092507 B2 | 10/1995 |
| JP | 09-096686 A | 4/1997 |
| JP | 2000-125578 A | 4/2000 |
| JP | 2002-280834 A | 9/2002 |
| JP | 2003-084085 A | 3/2003 |

* cited by examiner

*Primary Examiner*—Vit W Miska
(74) *Attorney, Agent, or Firm*—Foley & Lardner LLP

(57) ABSTRACT

Using an oscillating unit (601) that can start oscillation with a low voltage, an oscillation signal (S1) of the oscillating unit (601) is amplified via a waveform shaping unit (603), and is fed to a boosting control unit (105). A boosting unit (103) is caused to perform a boosting behavior by a boosting clock (Sa) with the same frequency as an oscillation frequency of the oscillation signal (S1) just after the oscillating unit (601) starts. Thereby, a whole electronic timepiece (100) can be self-actuated, even if a generation voltage is low. Further, the oscillating unit (601) is constituted such that a operating current always becomes constant. Thereby, the electronic timepiece can be provided with an electricity-generating unit (101) such as a solar cell with a one-stage constitution having a low open voltage.

18 Claims, 20 Drawing Sheets

ELECTRONIC TIMEPIECE

TECHNICAL FIELD

The present invention relates to an electronic timepiece and an electronic device that time or operate by applying a predetermined operating voltage thereto, and an actuating method therefor. In particular, the present invention relates to an electronic timepiece and an electronic device that converts external energy to electric energy, and an actuating method therefor.

BACKGROUND ART

Electronic timepieces with an electricity-generating unit that converts external energy such as optical or mechanical energy to electric energy to utilize the electronic energy for driving an electronic device have been proposed.

Examples of an electronic timepiece with such electricity-generating unit are a mechanically electricity-generating type timepiece that converts mechanical energy of a rotary weight to electric energy to utilize the same, a temperature-difference electricity-generating type timepiece that generates electric power by serializing a plurality of thermocouples to utilize temperature differences between both ends of the thermocouples, and a solar-battery type timepiece that utilizes a solar battery.

As the electronic timepiece using a solar battery as the electricity-generating unit, an electronic timepiece using a solar battery with a one-stage cell constitution has been proposed (for example, see Japanese Patent Application Laid-open No. H9-96686, pages 5 to 7 and FIG. 1). As compared with a conventional solar battery having a four-stage cell constitution, the solar battery having the one-stage cell constitution has excellent appearance and has excellent efficiency on an effective light receiving area, because a light receiving face thereof does not include any splitting slit. Therefore, the solar battery having the one-stage cell constitution is expected to be an electricity-generating unit for an electronic timepiece.

As an electronic timepiece with such electricity-generating unit, an electronic timepiece provided with a power-source peripheral circuit that boosts an electricity generation output from an electricity-generating unit by using a boosting unit and stores the same has been proposed. FIG. 23 is a block diagram of an electronic timepiece 2300 proposed. In the conventional electronic timepiece 2300, a current path is formed of an electricity-generating unit 2301, a charging diode 2306, and a timing unit 2304.

The timing unit 2304 is a timepiece block that displays clock time by utilizing electric energy. An output of the electricity-generating unit 2301 can be boosted via a boosting unit 2302 to charge a storage unit 2303.

In the electronic timepiece 2300, when the storage unit 2303 is discharged to be approximately empty and the electricity-generating unit 2301 is not generating electric power, the timing unit 2304 stops its operation. Thereafter, when the electricity-generating unit 2301 starts to generate electricity, generated energy is first fed to the timing unit 2304 and a boosting control unit 2305.

When a generated voltage in the electricity-generating unit 2301 reaches a level sufficient for actuating the timing unit 2304 (for example, 1.0 voltage) or higher, the timing unit 2304 starts re-actuation behavior. A frequency-divided clock signal Sx is outputted from the timing unit 2304 and a signal (Sy in FIG. 23) obtained by further frequency-dividing the signal Sx is fed from the boosting control unit 2305 to the boosting unit 2302. As a result, the boosting unit 2302 starts a boosting behavior.

When the timing unit 2304 once starts a behavior, even if the generated voltage from the electricity-generating unit 2301 slightly lowers, an timing behavior of the timing unit 2304 is maintained and the storage unit 2303 can be charged up to a high voltage, because the generated output is boosted by the boosting unit 2302 and fed to the timing unit 2304.

However, in an electronic timepiece provided with the power-source peripheral circuit, an open voltage corresponding to one stage in a solar battery used as an electricity-generating unit is just under about 0.7 voltage even under a high illumination density. On the other hand, a crystal oscillation circuit ordinarily used for the conventional electronic timepiece 2300 shown in FIG. 23 requires at lowest about 0.6 voltage to 0.8 voltage for oscillation actuation.

Accordingly, when a solar battery having a one-stage cell constitution is intended to be utilized as the electricity-generating unit 2301, a voltage drop larger than at least 0.1 voltage occurs in the charging diode 2306. Thereby, since a margin of an oscillation starting voltage in the crystal oscillation circuit to a voltage applied to the crystal oscillation circuit itself in the timing unit 2304 is completely lost, the voltage applied becomes lower than the oscillation starting voltage in the crystal oscillation circuit. As a result, there is a problem that the crystal oscillation circuit can not start.

Particularly, since an electronic timepiece for a woman is smaller than an electronic timepiece for a man, it must use a solar battery with a small effective light-receiving area, so that the above problem becomes significant. Therefore, there is another problem that the crystal oscillation circuit can not be installed in the electronic timepiece for a woman.

Currently, an electronic timepiece where a solar battery that has a one-stage cell constitution similarly and is formed in a ring shape is used and the solar battery is attached at a peripheral edge of a timepiece dial is put in a practical use. However, since a light-receiving area in the solar battery can not be enlarged due to a structure of a timepiece, it is necessary to receive not only direct light but also light reflected from the timepiece dial. Accordingly, since only a white-base color, which reflects light, can be adopted for the timepiece dial, there is such a problem that the timepiece dial is restricted regarding its design.

The present invention has been made in view of these problems, and an object thereof is to provide an electronic timepiece and an electronic device that can be reduced in size by performing reliable actuation of the electronic timepiece and the electronic device with a voltage lower than a voltage required for actuation, and an actuating method. Further, another object of the present invention is to provide an electronic timepiece and an electronic device that can achieve improvement of decorative performance including a color of the electronic timepiece or the electronic device, and an actuating method.

DISCLOSURE OF THE INVENTION

In order to solve the above problems and achieve the object, according to one aspect of the present invention, an electronic timepiece includes a power source voltage generating unit that converts external energy to electric energy to generate a power source voltage lower than a predetermined operating voltage; an oscillation signal output unit that outputs a predetermined oscillation signal by application of the power source voltage generated by the power source voltage generating unit; a boosting unit that boosts the power source voltage generated by the power source voltage generating unit up to at least the predetermined operating voltage; and a timing unit that times by application of the predetermined operating voltage boosted up by the boosting unit based upon an oscillation signal outputted by the oscillation signal output unit.

According to the present invention, the power source voltage can be boosted up to an operating voltage by applying a power source voltage lower than the operating voltage.

According to another aspect of the present invention, the electronic timepiece further includes a boosting control unit that controls the boosting unit to boost the power source voltage only for a predetermined time based upon the predetermined oscillation signal.

According to the present invention, a boosting behavior can be performed securely for the predetermined time, and an operating voltage can be obtained after the predetermined time elapses.

According to still another aspect of the present invention, the electronic timepiece further includes a frequency-dividing unit that frequency-divides an oscillation signal outputted by the oscillation signal output unit; and a boosting-stop-instruction-signal output unit that outputs a boosting stop instruction signal for instructing stop of the boosting behavior performed by the boosting unit based upon a frequency-dividing signal outputted from the frequency-dividing unit when the predetermined time elapses after the oscillation signal output unit outputs the oscillation signal. In the electronic timepiece, the boosting control unit stops boosting based upon a boosting stop instruction signal outputted by the boosting-stop-instruction-signal output unit. According to the present invention, a boosting behavior can be controlled using a frequency-divided signal from the frequency-dividing unit that is generally provided in an electronic timepiece, when the predetermined time elapses, and the number of parts can be reduced.

According to still another aspect of the present invention, the electronic timepiece further includes a boosting-stop-instruction-signal output unit that outputs a boosting stop instruction signal for instructing stop of the boosting behavior performed by the boosting unit when the predetermined time elapses after the oscillation signal output unit starts. In the electronic timepiece, boosting is stopped based upon a boosting stop instruction signal outputted by the boosting-stop-instruction-signal output unit. According to the present invention, since the boosting-stop-instruction-signal output unit that controls a boosting behavior when a predetermined time elapses is provided separately from the frequency-dividing unit that is generally incorporated into an electronic timepiece, a predetermined time interval can be changed by only replacement of a boosting-stop-instruction-signal output unit to another, when the predetermined time is changed.

According to still another aspect of the present invention, the electronic timepiece further includes a time information input unit that inputs time information representing one of a plurality of the predetermined times whose time intervals are different from one another; a time information storage unit that stores the time information inputted by the time information input unit; a time information extracting unit that extracts the time information stored in the time information storage unit by application of a power source voltage generated from the power source voltage generating unit thereto; and a boosting stop instruction signal producing unit that generates a boosting stop instruction signal for instructing stop of the boosting behavior performed by the boosting unit based upon the time information extracted by the time information extracting unit, when a predetermined time indicated by the time information extracted elapses. In the electronic timepiece, boosting is stopped based upon the boosting stop instruction signal generated by the boosting stop instruction signal producing unit.

According to the present invention, the predetermined time can be properly changed according to a performance of an electronic timepiece by operation of an operator, and a boosting behavior and actuation suitable for the performance of the electronic timepiece can be performed.

According to still another aspect of the present invention, the electronic timepiece further includes a power source voltage detecting unit that detects whether the power source voltage has been boosted up to the predetermined operating voltage by the boosting unit; and a boosting control unit that controls the boosting unit and boosts the power source voltage based upon the predetermined oscillation signal and the detection result detected by the power source voltage detecting unit. According to the present invention, an oscillation signal is outputted and a starting voltage can be boosted up to the operating voltage by applying a generation voltage that can be generated by the power source voltage generating unit to the oscillation signal output unit. The electronic timepiece can be actuated by the oscillation signal and the operating voltage.

According to still another aspect of the present invention, in the electronic timepiece, the boosting control unit controls the boosting behavior performed by the boosting unit based upon the oscillation signal and the detection result detected by the power source voltage detecting unit, when a predetermined time elapses after the oscillation signal output unit outputs the oscillation signal.

According to the present invention, an oscillation signal is outputted and the power source voltage can be boosted up to the operating voltage by applying a generation voltage that can be generated by the power source voltage generating unit to the oscillation signal output unit. The electronic timepiece can be actuated by the oscillation signal and the operating voltage even after the predetermined time elapses.

According to still another aspect of the present invention, in the electronic timepiece, the oscillation signal output units includes an oscillating circuit that oscillates when the starting voltage is applied to the oscillating circuit; a resonating circuit that resonates according to a signal outputted from the oscillating circuit; and a constant current circuit that feeds a constant current; an oscillation inverter that is supplied with a constant current from the constant current circuit to reverse and amplify a signal outputted from the resonating circuit to output the oscillation signal. According to the present invention, an overtone oscillation can be suppressed by using the constant current circuit.

According to still another aspect of the present invention, in the electronic timepiece, the timing unit is provided with a logic circuit constituted of a plurality of field effect transistors, and the oscillation inverter is constituted of a field effect transistor having a threshold voltage lower than that of the field effect transistor included in the timing unit.

According to still another aspect of the present invention, in the electronic timepiece, the timing unit is provided with a logic circuit constituted of a plurality of field effect transistors, and a waveform shaping unit that is constituted of a field effect transistor having a threshold voltage lower than that of the field effect transistor included in the timing unit and that shapes a waveform of an oscillation signal outputted from the oscillation signal output unit to output the same to the timing unit.

According to still another aspect of the present invention, in the electronic timepiece, the timing unit is provided with a logic circuit constituted of a plurality of field effect transistors, and the boosting control unit is constituted of a field effect transistor having a threshold voltage lower than that of the field effect transistor included in the timing unit.

According to still another aspect of the present invention, the electronic timepiece further includes a bias circuit that is constituted of a field effect transistor having the same threshold as that of the oscillating circuit and that applies a predetermined bias voltage to the oscillation inverter.

According to still another aspect of the present invention, the electronic timepiece further includes a waveform shaping unit that shapes a waveform of an oscillation signal outputted from the oscillation signal output unit to output the same to the timing unit, and a bias circuit that is constituted of a field effect transistor having the same threshold as that of the waveform shaping unit and that applies a predetermined bias voltage to the waveform shaping unit. According to the present invention, reduction in power consumption can be achieved. A current required for an oscillation behavior can be reduced significantly, and improvement in oscillation starting characteristics can be achieved.

According to still another aspect of the present invention, an electronic device that is activated by application of a predetermined operating voltage based upon a predetermined oscillation signal includes a power source voltage generating unit that converts external energy to electric energy to generate a power source voltage lower than a predetermined operating voltage; an oscillation signal output unit that outputs the predetermined oscillation signal by a power source voltage generated by the power source voltage generating unit; and a boosting unit that boosts the power source voltage generated by the power source voltage generating unit up to at least the predetermined operating voltage. According to the present invention, the power source voltage can be boosted up to the operating voltage by application of a power source voltage lower than the operating voltage.

According to still another aspect of the present invention, an actuation method for actuating an electronic device that is activated by application of a predetermined operating voltage based upon a predetermined oscillation signal includes converting external energy to electric energy and generating a power source voltage lower than a predetermined operating voltage; outputting the predetermined oscillation signal by a power source voltage generated in the generating; and boosting up the power source voltage generated in the generating to at least the predetermined operating voltage. According to the present invention, the power source voltage can be boosted to the operating voltage by application of a power source voltage lower than the operating voltage.

BEST MODE FOR CARRYING OUT THE INVENTION

An electronic timepiece and an actuating method of the electronic timepiece according to an embodiment of the present invention will be explained below in detail with reference to the drawings.

(Whole Configuration of Electronic Watch)

Figure 1:
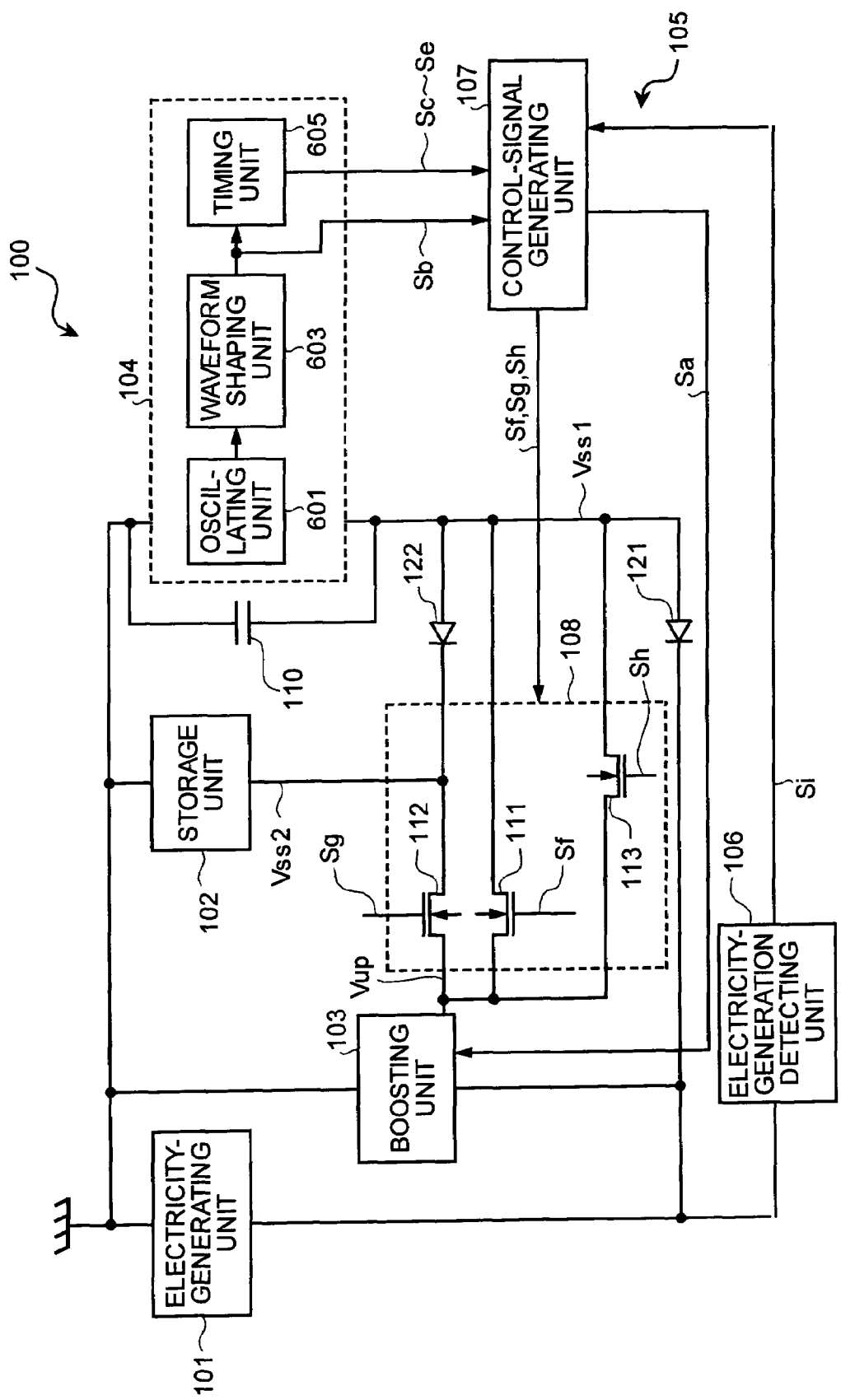
FIG. 1 is a schematic of an electronic timepiece according to an embodiment of the present invention.

FIG. 1 is a schematic of a whole configuration of an electronic timepiece according to an embodiment of the present invention. An electronic timepiece 100 includes an electricity-generating unit 101, a storage unit 102, a boosting unit 103, a timepiece block 104, a boosting control unit 105, and an electricity-generation detecting unit 106.

The electricity-generating unit 101 converts external energy to electric energy and generates a power source voltage lower than a predetermined operating voltage that activates the electronic timepiece 100. The electricity-generating unit 101 is a solar battery module constituted of, for example, a one-stage solar cell. A positive terminal of the electricity-generating unit 101 is grounded and a negative terminal thereof is connected to a boosting input terminal of the boosting unit 103. When light is irradiated on the electricity-generating unit 101, an open voltage of about 0.4 voltage to 0.7 voltage is generated. The open voltage serves as a power source voltage.

The storage unit 102 stores power outputted from the electricity-generating unit 101 therein and it activates the timepiece block 104 by the stored power even during non-generation of the electricity-generating unit 101. The storage unit 102 is grounded to a positive electrode. A negative electrode terminal Vss2 of the storage unit 102 is connected to a switching control unit 108. The storage unit 102 can adopt a lithium ion secondary battery, for example.

The boosting unit 103 boosts a power source voltage generated by the electricity-generating unit 101 to at least predetermined operating voltage. The boosting unit 103 is a boosting circuit that switches capacitors between a serial state thereof and a parallel state thereof to perform a boosting behavior. An input side of the boosting unit 103 is connected with an output of the electricity-generating unit 101.

The boosting unit 103 is constituted to be inputted with a boosting clock Sa serving as a boosting start signal that starts a boosting behavior, and it performs a 4-times boosting behavior by conducting switching of internal capacitors according to the input boosting clock Sa. Thereby, a boosting behavior can start simultaneously with an oscillation start, and rapid actuation of the electronic timepiece 100 can be conducted. Here, a boosting output terminal name of the boosting unit 103 is represented as Vup. A specific configuration of the boosting unit 103 will be described later.

The timepiece block 104 is a unit that generates basic signals for a timing behavior, and charging and discharging behaviors of the electronic timepiece 100. The timepiece block 104 includes an oscillating circuit 601, a waveform shaping circuit 603, and a timing unit 605.

The timepiece block 104 is connected with a capacitor 110 in parallel for stabilizing a voltage between terminals of the timepiece block 104 to an intermittent load behavior. The capacitor 110 is grounded at its positive terminal and a negative terminal Vss1 thereof is connected to the electricity-generating unit 101, the boosting unit 103, and the switching control unit 108. In this specification, a voltage value of the negative terminal Vss1 is also called Vss1. As the capacitor 110, one having a capacitance of 10 microfarads is used as one example. Details of an internal configuration of the timepiece block 104 or respective signals outputted from the timepiece block 104 will be described later.

The boosting control unit 105 is a circuit that behavior-controls the boosting unit 103, and includes a control-signal generating unit 107 and a switching control unit 108. The control-signal generating unit 107 receives various signals (Sb, Sc, Sd, and Se) outputted from the timepiece block 104 and a signal Si outputted from the electricity-generation detecting unit 106, and generates and outputs various control signals (Sa, Sf, Sg, and Sh).

A first charging-switch signal Sf, a second charging-switch signal Sg, and a third charging-switch signal Sh of these control signals are outputted to the switching control unit 108. A boosting clock Sa is outputted to the boosting unit 103. Details of an internal configuration of the control-signal generating unit 107 and the various control signals (Sa, Sf, Sg, and Sh) will be described later.

The switching control unit 108 includes a first charging switch 111, a second charging switch 112, and a third charging switch 113. The first to third charging switches 111 to 113 are each constituted of, for example, an N-channel MOSFET, and they control a boosting output from the boosting unit 103 to the timepiece block 104 and the storage unit 102 in synchronization with a behavior of the boosting unit 103.

A source terminal of the first charging switch 111 is connected to a negative terminal Vss1 of the capacitor 110. A drain terminal of the first charging switch 111 is connected to a boosting output terminal Vup of the boosting unit 103. A gate terminal of the first charging switch 111 is connected to an output terminal of the control-signal generating unit 107, and when the first charging-switch signal Sf is inputted, the first charging switch 111 puts the boosting unit 103 and the timepiece block 104 in an electrically conductive state therebetween.

A source terminal of the second charging switch 112 is connected to a negative terminal Vss2 of the storage unit 102. A drain terminal of the second charging switch 112 is connected to the boosting output terminal Vup of the boosting unit 103. A gate terminal of the second charging switch 112 is connected to an output terminal of the control-signal generating unit 107, and when the second charging-switch signal Sg is inputted, the second charging switch 112 puts the boosting unit 103 and the storage unit 102 in an electrically conductive state therebetween.

A source terminal of the third charging switch 113 is connected to a negative terminal Vss1 of the capacitor 110. A drain terminal of the third charging switch 113 is connected to the boosting output terminal Vup of the boosting unit 103. A gate terminal of the third charging switch 113 is connected to the output terminal of the control-signal generating unit 107, and when the third charging-switch signal Sh is inputted, the third charging switch 113 puts the boosting unit 103 and the timepiece block 104 in an electrically conductive state therebetween.

A first diode 121 feeds power of the electricity-generating unit 101 to the timepiece block 104, when the timepiece block 104 is re-actuated after behavior thereof being once stopped. An anode terminal of the first diode 121 is connected to the negative terminal Vss1 of the capacitor 110, and a cathode terminal thereof is connected to the negative terminal of the electricity-generating unit 101.

A second diode 122 feeds power stored in the storage unit 102 to the timepiece block 104 even during non-generation of the electricity-generating unit 101. An anode terminal of the second diode 122 is connected to the negative terminal Vss1 of the capacitor 110, and a cathode terminal thereof is connected to a negative terminal of the storage unit 102, namely, Vss2.

As the first diode 121 and the second diode 122, for example, Shottky barrier diodes with a forward voltage drop of about 0.1 voltage can be used.

On the other hand, the electricity-generation detecting unit 106 is a circuit block including an amplifying circuit for detecting a generation state of the electricity-generating unit 101. The electricity-generation detecting unit 106 outputs an electricity-generation detecting signal Si to the control-signal generating nit 107. The electricity-generation detecting unit 106 operates to output the electricity-generation detecting signal Si as a high level, when a predetermined electricity-generation amount is being outputted from the electricity-generating unit 101, otherwise output the electricity generation detecting signal as a low level.

(Specific Configuration of Boosting Unit)

Figure 2:
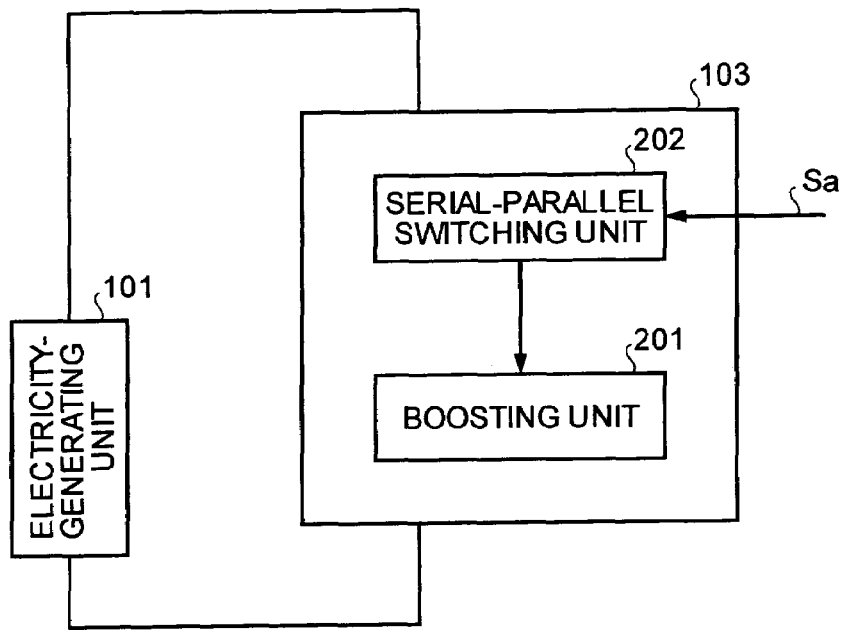
FIG. 2 is a schematic of a boosting unit according to the embodiment.

Next, a specific configuration of the boosting unit 103 shown in FIG. 1 will be explained. FIG. 2 is a block diagram of the boosting unit 103. The boosting unit 103 includes a boosting circuit 201 on which a power source voltage generated by the electricity-generating unit 101 is applied and a serial-parallel switching circuit 202.

Figure 3:
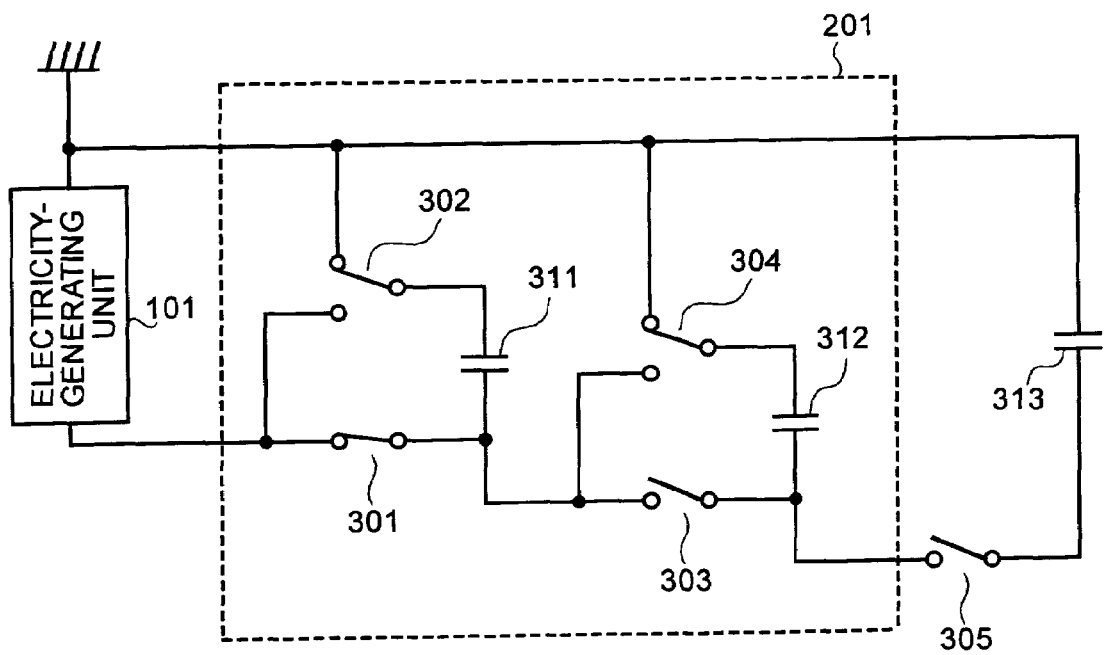
FIG. 3 to FIG. 5 are circuit schematics of the boosting circuit for indicating boosting behaviors of the boosting unit according to the embodiment.
Figure 4:
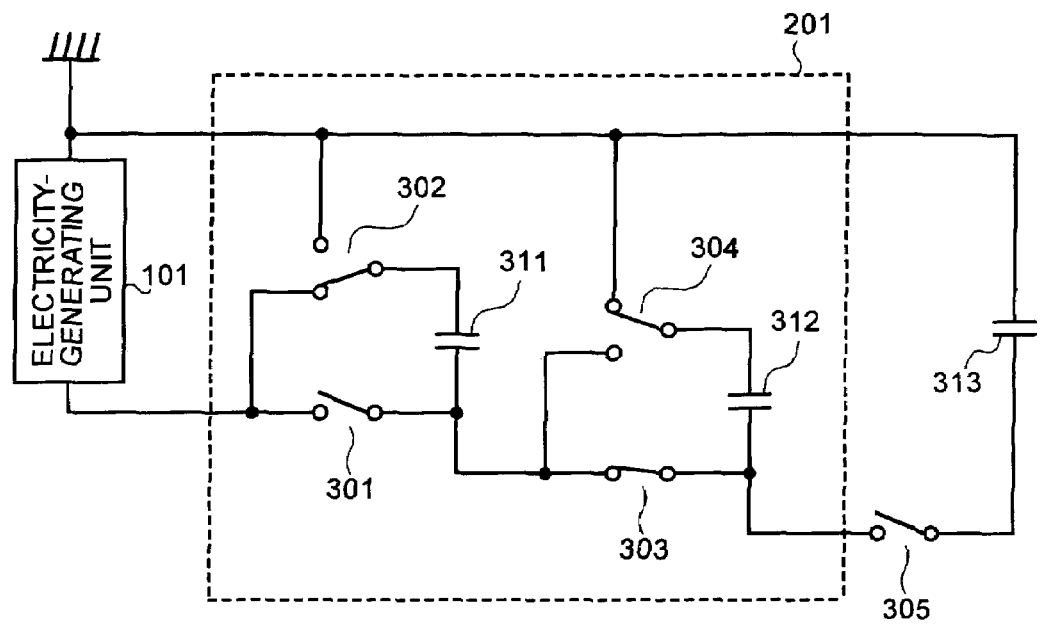
Figure 5:
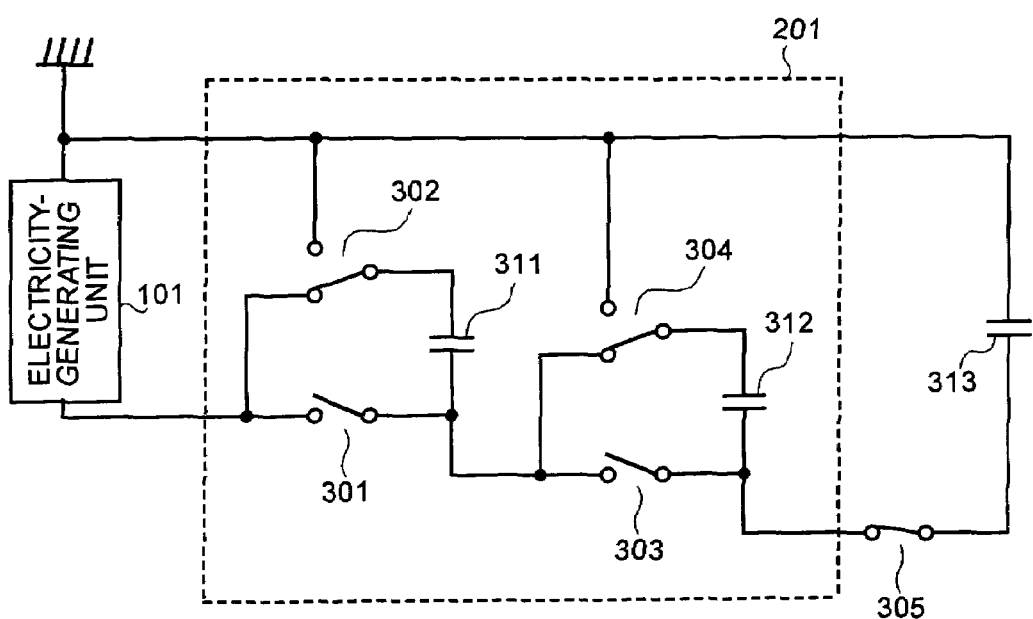

As shown in FIG. 3 to FIG. 5, the boosting circuit 201 includes circuits 301 to 304, each being constituted of a MOS field effect transistor (hereinafter, "FET"), and capacitors 311 and 312. The switch circuits 301 to 304 of the MOSFET can control the switching sufficiently even if an output of the boosting control unit 105 has a small amplitude (0.3 voltage or more) due to a low threshold used in a logic circuit in a portion of the boosting control unit 105 described later. A switch circuit 305 is constituted of either one switch of the first charging switch 111 to the third charging switch 113 shown in FIG. 1, and a capacitor 313 is constituted of either one of the storage unit 102 or the capacitor 110.

The serial-parallel switching circuit 202 actuates when a power source voltage is applied from the electricity-generating unit 101, and inputs a switching signal to the switch circuits 301 to 304 of the MOSFET when a boosting clock Sa is inputted from the control-signal generating unit 107.

Here, a boosting behavior of the boosting unit 103 will be explained with reference to FIG. 3 to FIG. 5. As shown in FIG. 3, first, by controlling the switch circuit 301 and the switch circuit 302, a boosting capacitor 311 is connected to the electricity-generating unit 101 in parallel to charge the boosting capacitor 311. Unless a load is connected to a storage capacitor 313, the boosting capacitor 311 is charged up to an open voltage of the electricity-generating unit 101.

Next, as shown in FIG. 4, by controlling the switch circuits 301 to 304, a voltage obtained by connecting the boosting capacitor 311 to the electricity-generating unit 101 in series is applied to a boosting capacitor 312 to charge the boosting capacitor 312. As a result, the boosting capacitor 312 is charged up to a voltage of two times the open voltage of the electricity-generating unit 101.

As shown in FIG. 5, by applying a voltage obtained by connecting the boosting capacitor 311 and the boosting capacitor 312 to the electricity-generating unit 101 in series to the storage capacitor 313, the storage capacitor 313 is charged. As a result, the storage capacitor 313 is charged up to a voltage of four times the open voltage of the electricity-generating unit 101. That is, when the open voltage of the generation voltage is 0.4 voltage, boosting is performed up to 1.6 voltage.

(Configuration Explanation About Watch Block)

Figure 6:
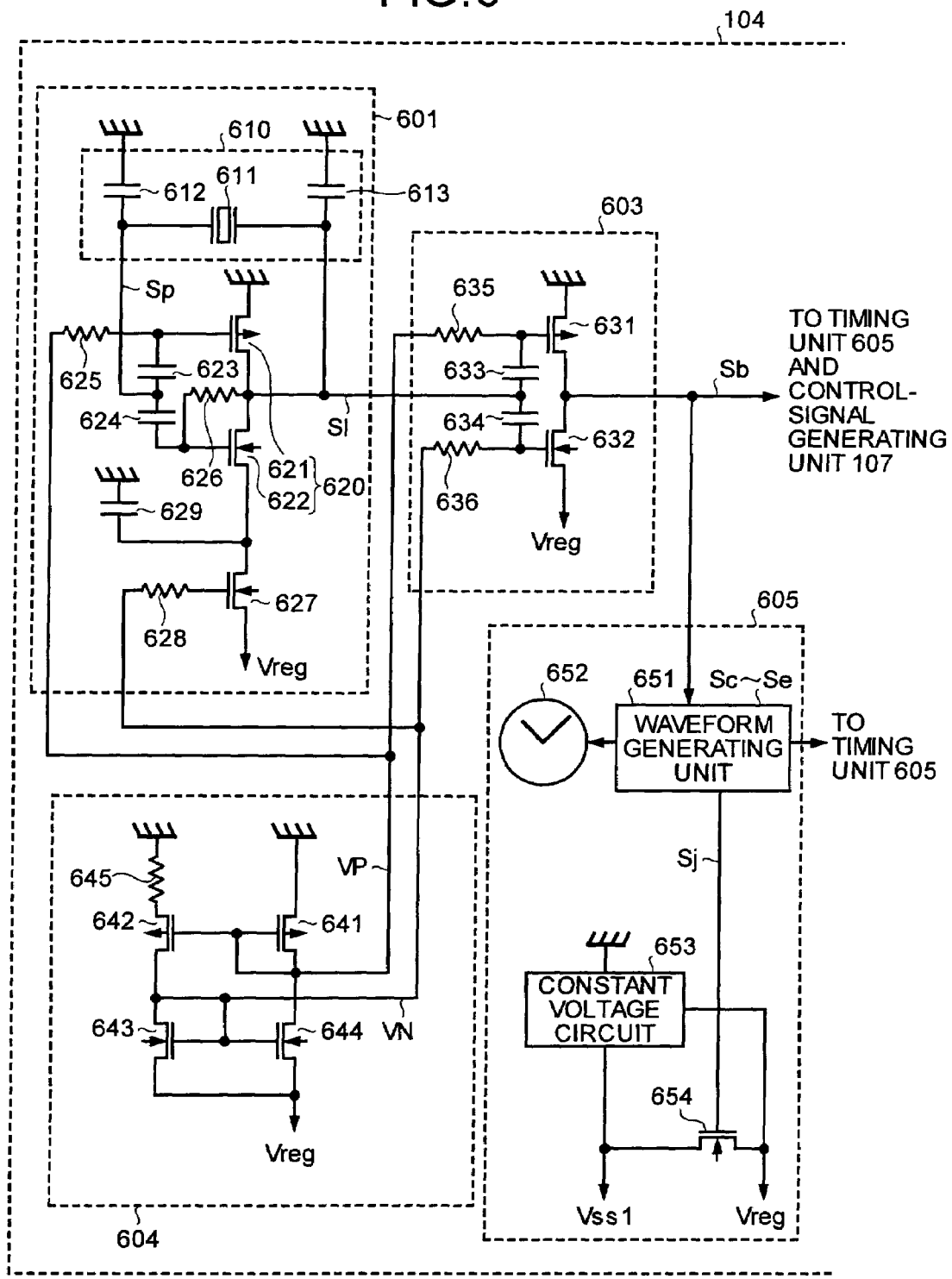
FIG. 6 is a circuit schematic of a timepiece block of the electronic timepiece according to the embodiment.

Next, a configuration of the timepiece block 104 shown in FIG. 1 will be explained. FIG. 6 is a circuit schematic of a timepiece block in the electronic timepiece according to the embodiment of the present invention. The timepiece block 104 includes an oscillating unit 601, a waveform shaping unit 603, a bias circuit 604, and a timing unit 605. The timing unit 605 includes a waveform generating unit 651, a clock-time-display member-652, and a constant voltage circuit 653.

(Configuration of Oscillating Unit) The oscillating unit 601 outputs an oscillation output signal S1 by applying a power source voltage generated the electricity-generating unit 101. The oscillating unit 601 includes a resonating circuit 610.

The resonating circuit 610 has a crystal oscillator 611, a first oscillation capacitance 612, and a second oscillation capacitance 613. The resonating circuit 610 determines an oscillation frequency in the oscillating unit 601.

The crystal oscillator 611 is a crystal oscillator used in an ordinary electronic timepiece. The first oscillation capacitance 612 and the second oscillation capacitance 613 are capacitors incorporated into an integrated circuit. For example, the first oscillation capacitance 612 has the capacitance of 8 picofarads and the second oscillation capacitance 613 has the capacitance of 4 picofarads.

Positive terminals of the first oscillation capacitance 612 and the second oscillation capacitance 613 are respectively grounded, and negative terminals thereof are respectively connected to both ends of the crystal oscillator 611. The negative terminal of the oscillation capacitance 612 is an output terminal of the resonating circuit 610, but an oscillation input signal Sp for oscillation of the crystal oscillator 611 is inputted to the negative terminal of the oscillation capacitance 612

The negative terminal of the second oscillation capacitance 613 is an input terminal of the resonating circuit 610, but it outputs an oscillation output signal SI outputted from the crystal oscillator 611. A resonating frequency in the resonating circuit 610 is set to be 32 kilohertz (specifically, 32768 hertz), for example.

The oscillating unit 601 further includes a first transistor element 621 and a second transistor element 622, a first coupling capacitance 623, a second coupling capacitance 624, a first bias resistance 625, a second bias resistance 626, a third transistor element 627, a third bias resistance 628, and a stabilizing capacitance 629.

The first transistor element 621 and the second transistor element 622 constitutes an oscillating inverter 620 serving as an inverter (reversing and amplifying) circuit. The resonating circuit 610 is connected between an input and an output of the oscillating inverter 620 to form a feedback circuit.

The first bias resistance 625, the second bias resistance 626, and the third bias resistance 628 are each constituted of a circuit element having a high resistance. As the first bias resistance 625, the second bias resistance 626, and the third bias resistance 628, ones having an electric resistance of 500 megaohms can be used. The first coupling capacitance 623, the second coupling capacitance 624, and the stabilizing capacitance 629 may be each constituted of a capacitor.

The first transistor element 621 is constituted of, for example, a P-channel MOSFET. The second transistor element 622 and the third transistor element 627 are each constituted of, for example, an N-channel MOSFET.

As the first transistor element 621, the second transistor element 622, and the third transistor element 627, elements with a low absolute value of a threshold voltage (for example, 0.3 voltage) are used. Specifically, the thresholds of the second transistor element 622 and the third transistor element 627 that are the N-channel MOSFETs are 0.3 voltage, and the threshold of the first transistor element 621 that is the P-channel MOSFET is −0.3 voltage.

A gate terminal of the first transistor element 621 and a gate terminal of the second transistor element 622 are connected to each other via the first coupling capacitance 623 and the second coupling capacitance 624. A connecting point of the first coupling capacitance 623 and the second coupling capacitance 624 is connected to the resonating circuit 610, so that an oscillation input signal Sp is inputted into the resonating circuit 610.

A drain terminal of the first transistor element 621 and a drain terminal of the second transistor element 622 are connected to each other. Both the drain terminals are connected to the resonating circuit 610, and an oscillation output signal S1 from the resonating circuit 610 is inputted to them. A source terminal of the first transistor element 621 is grounded. A source terminal of the second transistor element 622 is connected to a negative terminal of the stabilizing capacitance 629. A positive terminal of the stabilizing capacitance 629 is grounded.

The stabilizing capacitance 629 is provided for the purpose of temporarily supplying a current required for behavior of the oscillating inverter 620.

A drain terminal of the third transistor element 627 is connected to a negative terminal of the stabilizing capacitance 629. A source terminal of the third transistor element 627 is connected to a constant-voltage output terminal Vreg of the constant voltage circuit 653.

A constant voltage obtained from the bias circuit 604 via a third bias resistance 628 is applied to the gate terminal of the third transistor element 627, so that the third transistor element 627 activates as a constant current circuit. The constant current circuit performs current supply to the stabilizing capacitance 629.

The gate terminal of the first transistor element 621 is dc-biased with a first bias voltage VP, which is an output of the bias circuit 604, via the first bias resistance 625. The gate terminal of the third transistor element 627 is dc-biased with a second bias voltage VN via the third bias resistance 628. The first bias voltage VP and the second bias voltage VN are generated by the bias circuit 604. A configuration of the bias circuit 604 will be described later.

Regarding a direct current, a constant current of 115 nanoamperes flows in the first transistor element 621 due to the first bias voltage VP. The third transistor element 627 is set to have such a dimension that it operates as a constant current circuit for 20 nanoamperes.

Since the second bias resistor 626 performs self-feedback to the second transistor element 622, it is inserted between the oscillation output signal S1 and the gate of the second transistor element 622.

(Configuration of Waveform Shaping Unit)

The waveform shaping unit 603 includes for example, a fourth transistor element 631 that is a P-channel MOSFET, a fifth transistor element 632 that is a N-channel MOSFET, a third coupling capacitance 633, a fourth coupling capacitance 634, a fourth bias resistor 635, and a fifth bias resistance 636. The fourth transistor element 631 and the fifth transistor element 632 constitute an inverter (reversing and amplifying) circuit. As the fourth transistor element 631 and the fifth transistor element 632, elements having the same absolute values of threshold voltages set to 0.3 voltage as that of the MOSFET used in the oscillating unit 601 are used.

A source terminal of the fourth transistor element 631 is grounded and a source terminal of the fifth transistor element 632 is connected to the constant-voltage output terminal Vreg. A gate terminal of the fourth transistor element 631 and a gate terminal of the fifth transistor element 632 are connected to each other via the third coupling capacitance 633 and the fourth coupling capacitance 634.

A connecting point of the third coupling capacitance 633 and the fourth coupling capacitance 634 is formed as an input terminal of the waveform shaping unit 603, and an oscillation output signal S1 is inputted to it. A drain terminal of the fourth transistor element 631 and a drain terminal of the fifth transistor element 632 are connected to each other to output a waveform-shaping output signal Sb.

The fourth bias resistance 635 is connected to a gate terminal of the fourth transistor element 631, and a first bias voltage VP outputted from the bias circuit 604 is applied to it. The fifth bias resistance 636 is connected to a gate-terminal of the fifth transistor element 632, and a second bias voltage VN outputted from the bias circuit 604 is applied to it.

(Configuration of Bias Circuit)

The bias circuit 604 includes a sixth transistor element 641 and a seventh transistor element 642 that are P-channel MOSFETs, an eighth transistor element 643 and a ninth transistor element 644 that are N-channel MOSFETs, and a reference resistance 645 that is a resistor element. As the sixth to ninth transistor elements 641 to 644, elements having same absolute values of threshold voltages set to the 0.3 voltage as that of the MOSFET used in the oscillating unit 601 are used.

The bias circuit 604 is a circuit that outputs a constant voltage, and it operates such that the first bias voltage VP has an output voltage value of about −0.3 voltage based upon the ground terminal and the second bias voltage VN has an output voltage value of about +0.3 voltage based upon the voltage value of the constant-voltage output terminal Vreg. The output voltage values are based upon the threshold voltages of the MOSFETs 641 to 644 constituting the bias circuit 604.

A source terminal of the sixth transistor element 641 is grounded and a source terminal of the seventh transistor element 642 is grounded via a reference resistance 645. The voltage values of the first bias voltage VP and the second bias voltage VN can be adjusted by the reference resistance 645. Here, a resistance element with a resistance of 2500 kiloohms can be used as the reference resistance 645.

A gate terminal of the seventh transistor element 642 is connected to the gate terminal and the drain terminal of the sixth transistor element 641. The first bias voltage VP is outputted from the gate terminal of the seventh transistor element 642. A source terminal of the eighth transistor element 643 and a source terminal of the ninth transistor element 644 are connected to the constant-voltage output terminal Vreg.

A gate terminal of the ninth transistor element 644 is connected to a gate terminal and a drain terminal of the eighth transistor element 643. The second bias voltage VN is outputted from the gate terminal of the ninth transistor element 644. Further, a drain terminal of the sixth transistor element 641 is connected to a drain terminal of the ninth transistor element 644. A drain terminal of the seventh transistor element 642 is connected to the drain terminal of the eighth transistor element 643.

The first bias voltage VP is applied to the gate terminal of the first transistor element 621 via the first bias resistance 625. Similarly, the first bias voltage VP is applied to the gate terminal of the fourth transistor element 631 via the fourth bias resistance 635.

The second bias voltage VN is applied to the gate terminal of the third transistor element 627 via the third bias resistance 628. Similarly, the second bias voltage VN is applied to the gate terminal of the fifth transistor element 632 via the fifth bias resistance 636.

Thus, since the bias circuit 604 is provided and DC bias is independently applied to each transistor element in the oscillating unit 601, even if each transistor element in the oscillating unit 601 is a low threshold transistor, the oscillating unit 601 can start oscillation with a lower voltage. Thereby, consumption power can be reduced.

(Configuration of Timing Unit)

The timing unit 605 includes a waveform generating unit 651, a clock-time display member 652, a constant voltage circuit 653, and a pull-down switch 654. The waveform generating unit 651 is a logic circuit that generates a pulse waveform that drives a step motor, by frequency-dividing a waveform-shaping output signal Sb obtained by shaping a waveform of an oscillating output signal S1, which is an output from the oscillating unit 601, in a multi-staged flip-flop circuit, and by synthesizing the frequency-divided signals obtained from a plurality of frequency-dividing stages.

The waveform generating unit 651 outputs a backup signal Sj that is kept in a high level for 1.5 seconds after power-on. The waveform generating unit 651 also outputs a backup original signal Sc, a boosting signal Sd, and a charging clock Se. The respective signals and a configuration of the waveform generating unit 651 will be explained later.

The clock-time display member 652 includes elements constituting, as one example, an analog timepiece, for example, time display elements such as a stepping motor (not shown), a reduction gear train, a timepiece dial, and dial pointers. The clock-time display member 652 drives the stepping motor based on a pulse waveform generated by the waveform generating unit 651 and rotates dial pointers via the reduction gear train to display a clock time. Since the clock-time display member 652 has an ordinary constitution, detailed explanation about a constitution thereof will be omitted.

The constant voltage circuit 653 is an ordinary constant-voltage circuit (a voltage regulator) outputting a constant voltage. Here, an output terminal of the constant voltage circuit 653 is represented as Vreg. The constant voltage circuit 653 is driven by a voltage between the ground and the terminal Vss1, which is an operating voltage for the timepiece block 104, and operates such that a voltage between the ground and the terminal Vreg becomes 0.8 voltage. Vss1 represents a negative terminal of the timepiece block 104.

Further, the constant-voltage output terminal Vreg is connected with a drain terminal of the pull-down switch 654. The pull-down switch 654 is constituted of, for example, an N-channel MOSFET. A backup signal Sj is inputted to the gate terminal of the pull-down switch 654, and the source terminal thereof is connected with a negative terminal Vss1 of the timepiece block 104.

The pull-down switch 654 is constituted of one having a threshold voltage of 0.3 voltage like the oscillating inverter 620 or the like. While the backup signal Sj is high, the output terminal Vreg of the constant voltage circuit 653 and the negative terminal Vss1 of the timepiece block 104 are put in a short-circuited state therebetween by the pull-down switch 654. On the other hand, while the backup signal Sj is low, the constant voltage circuit 653 operates such that a voltage value of the output terminal Vreg becomes a predetermined constant voltage.

In the constant voltage circuit 653, a potential equal to the negative terminal Vss1 of the timepiece block 104 appears at the output terminal Vreg of the constant voltage circuit 653, while a voltage between the ground and the terminal Vss1 is lower than 0.8 voltage like an ordinary constant voltage circuit.

The negative terminal Vss1 of the timepiece block 104 indicates a voltage between the ground and the terminal Vss1 in the following explanation, unless specially defined. Similarly, the negative terminal Vss2 of the storage unit 102 indicates a voltage between the ground and the terminal Vss2.

(Configuration of Waveform Generating Unit and Control-Signal Generating Unit)

Figure 7:
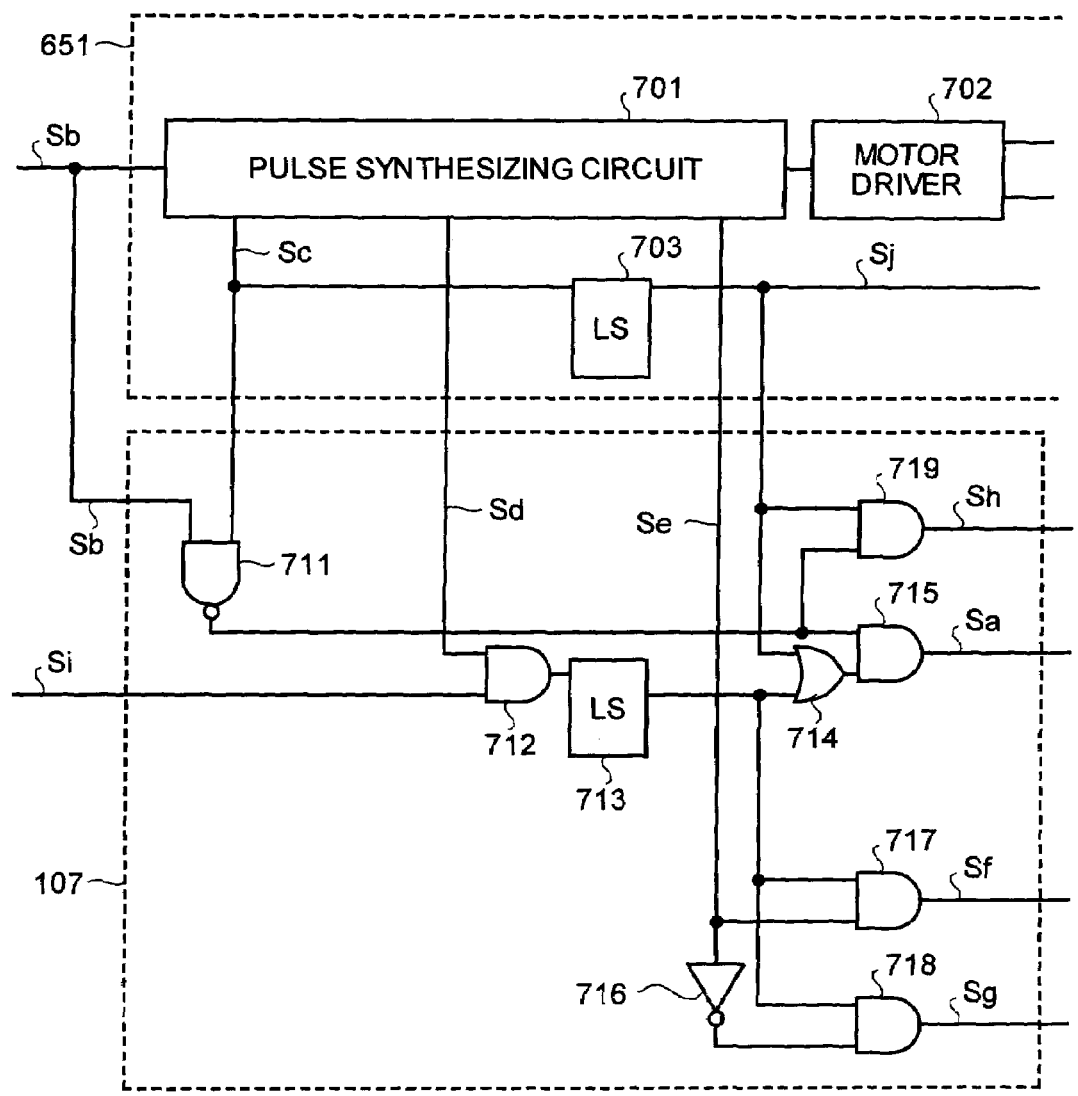
FIG. 7 is a circuit schematic of a waveform generating unit and a control-signal generating unit of the electronic timepiece according to the embodiment.

Next, circuit configurations of the waveform generating unit 651 and the control-signal generating unit 107 of the electronic timepiece according to the embodiment of the present invention will be explained. FIG. 7 is a circuit schematic of the waveform generating unit 651 and the control-signal generating unit 107 of the electronic timepiece according to the embodiment of the present invention.

The waveform generating unit 651 includes a pulse synthesizing circuit 701, a motor driver 702, and a first level shifter 703. The control-signal generating unit 107 includes a first NAND gate 711, a first AND gate 712, a second level shifter 713, a first OR gate 714, a second AND gate 715, a first inverter 716, a third AND gate 717, a fourth AND gate 718, and a fifth AND gate 719.

Threshold voltages of the pulse synthesizing circuit 701, the motor driver 702, the first level shifter 703, the second level shifter 713, the first inverter 716, the third AND gate 717, and the fourth AND gate 718 are set to have the same absolute value (here, 0.5 voltage) as that of a MOSFET adopted for a logic circuit in an ordinary electronic timepiece. Here, a threshold of an N-channel MOSET is 0.5 voltage, while a threshold of a P-channel MOSFET is −0.5 voltage.

Both N-channel and P-channel in the other logic circuits in the control-signal generating unit 107 are constituted of a CMOS circuit with a low threshold using a MOSFET with a low absolute value of a threshold voltage like the logic circuit used in the oscillating circuit 601. That is, the first NAND gate 711, the first OR gate 714, the second AND gate 715, and the fifth AND gate 719 are each constituted of a CMOS circuit with a low threshold (an absolute value of the threshold voltage is 0.3 voltage).

Next, the constitutions 701 to 703 in the waveform generating unit 651 will be explained specifically. The pulse synthesizing circuit 701 is an ordinal logic circuit constituted of a frequency-dividing circuit (for example, a multi-stage flip-flop circuit) and a plurality of logic gates used in an ordinary electronic timepiece. The pulse synthesizing circuit 701 receives an output of the oscillating circuit 601, namely, a waveform-shaping output signal Sb to divide the waveform-shaping output signal Sb, and synthesizes frequency-divided signals obtained from a plurality of frequency-dividing stages, thereby producing a motor-driving pulse waveform for rotationally driving a stepping motor (not shown) in the clock-time display member 652.

The pulse synthesizing circuit 701 outputs a backup original signal Sc, a boost signal Sd, and a charging clock Se. The boost signal Sd is a square wave with a 4096 hertz. Similarly, the charging clock Se is a square wave with 1 hertz. The backup original signal Sc is a pulse signal that is kept high for 1.5 seconds after the timepiece block is powered on. Details of the pulse synthesizing circuit 701 will be described later.

The motor driver 702 is a driver circuit that can level-convert a motor-driving pulse waveform from the pulse synthesizing circuit 701 to supply a large current for driving the stepping motor in the clock-time display member 652. Though not illustrated especially, an output terminal of the motor driver 702 is connected to a driving coil of the stepping motor in the clock-time display member 652. Since the motor driver 702 has a circuit configuration similar to that in an ordinary electronic timepiece, detailed explanation thereof is omitted.

The first level shifter 703 is a level shifter circuit that level-converts a logic signal of a level between the ground and the terminal Vreg to a signal of a level between the ground and the terminal Vss1. The backup original signal Sc is level-converted to a backup signal Sj by the first level shifter 703.

Next, the configurations 711 to 719 in the control-signal generating unit 107 will be explained specifically. The first NAND gate 711 is a-two-input NAND gate, and outputs a NOT signal of a logical product of the waveform-shaping output signal Sb and the backup original signal Sc.

The first AND gate 712 is a two-input AND gate, and outputs a logical product of the electricity-generation detecting signal Si and the boosting signal Sd. The second level shifter 713 is a level shifter circuit that level-converts a logical signal of a level between the ground and the terminal Vreg to a signal of a level between the ground and the terminal Vss1. The second level shifter 713 is a circuit that level-converts an output of the first AND gate 712.

The first OR gate 714 is a two-input OR gate, and outputs a logical sum of an output of the second level shifter 713 and a backup signal Sj. The second AND gate 715 is a two-input AND gate, and outputs a logical product of an output of the first NAND gate 711 and the first OR gate 714. An output of the second AND gate 715 is a boosting clock Sa.

The first inverter 716 inverts a charging clock Se outputted from the pulse synthesizing circuit 701, and outputs a NOT signal of the charging clock Se. The third AND gate 717 is a two-input AND gate, and outputs a logical product of an output of the second level shifter 713 and the charging clock Se. An output of the third AND gate 717 is a first charging-switch signal Sf.

The fourth AND gate 718 is a two-input AND gate, and outputs a logical product of an output of the second level shifter 713 and an output of the first inverter 716. An output of the fourth AND gate 718 is a second charging-switch signal Sg.

The fifth AND gate 719 is a two-input AND gate, and outputs a logical product of a backup signal Sj and an output of the first NAND gate 711. An output of the fifth AND gate 719 is a third charging-switch signal Sh.

Regarding a power source for behaviors of constituent elements in the waveform generating unit 651 and the control-signal generating unit 107, the pulse synthesizing circuit 701 and the first NAND gate 711 operate according to the output terminal Vreg (a voltage between the ground and the terminal Vreg) of the constant voltage circuit 653.

The other logic circuit elements in the waveform producing circuit 651 and the control-signal generating unit 107 operate according to the negative terminal Vss1 (a voltage between the ground and the terminal Vss1) of the timepiece block 104.

Figure 8:
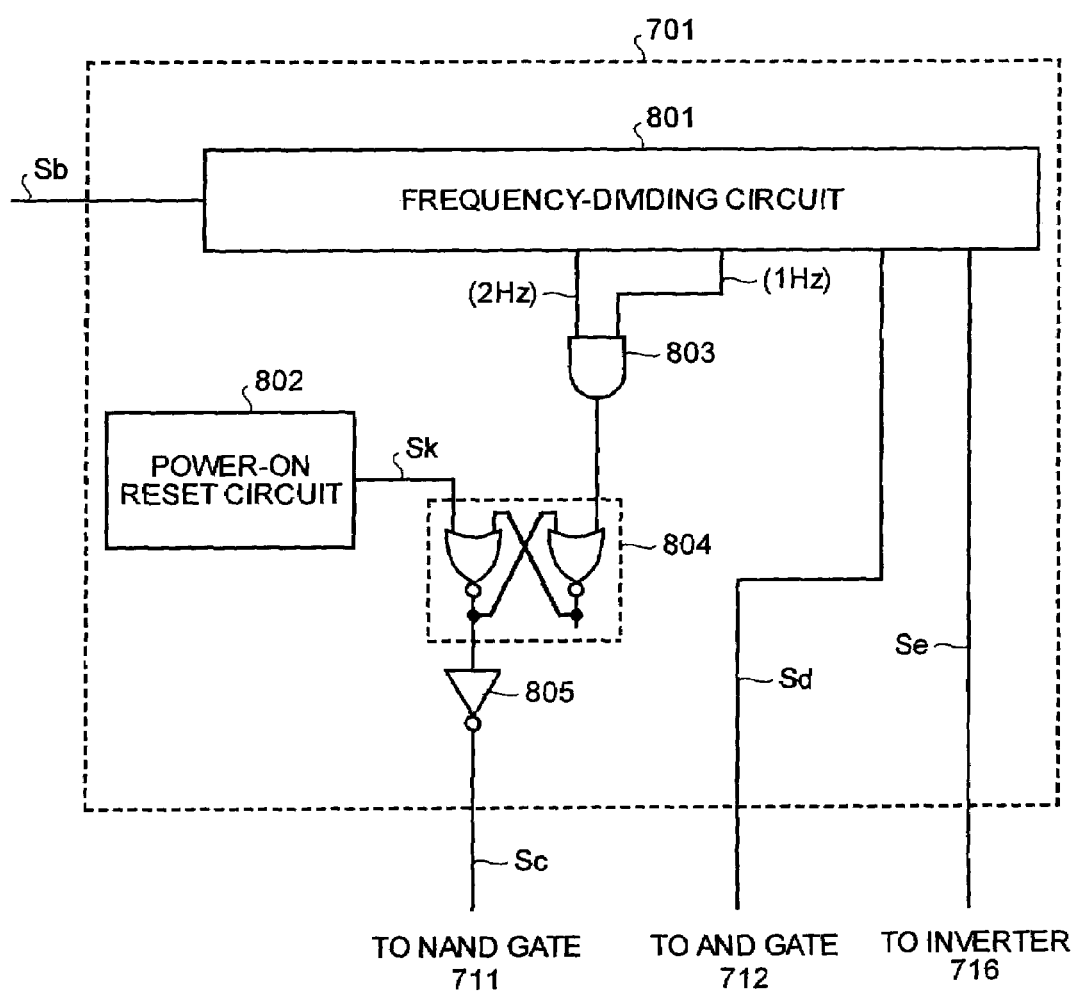
FIG. 8 is a schematic of a pulse synthesizing circuit according to the embodiment.

Next, the pulse synthesizing circuit 701 shown in FIG. 7 will be explained specifically. FIG. 8 is a circuit schematic of the pulse synthesizing circuit. The pulse synthesizing circuit 701 includes a frequency-dividing circuit 801, a power-on reset circuit 802, an AND gate 803, a latching circuit 804, and an inverter 805.

The frequency-dividing circuit 801 is a counter circuit constituted of a flip-flop train including 15 or more stages, and it frequency-divides a waveform-shaping output signal Sb outputted from the waveform shaping unit 603 to output the frequency-divided signals to motor drivers 702 (see FIG. 7). In the frequency-dividing circuit 801, the boost signal Sd and the charging clock Se are frequency-divided outputs from the frequency-dividing circuit.

The power-on reset circuit 802 is a circuit that outputs a power-on reset signal Sk. The power-on reset signal Sk is asserted low after outputting a high level signal (a ground potential) for several microseconds, when the circuit is powered on.

The AND gate 803 inputs a logic product of a pulse signal with 1 hertz and a pulse signal with 2 hertz outputted from the frequency-dividing circuit 801 into the latch circuit 804. The latch circuit 804 is a logic gate through which a logic signal passes or which holds a logic signal.

Figure 9:
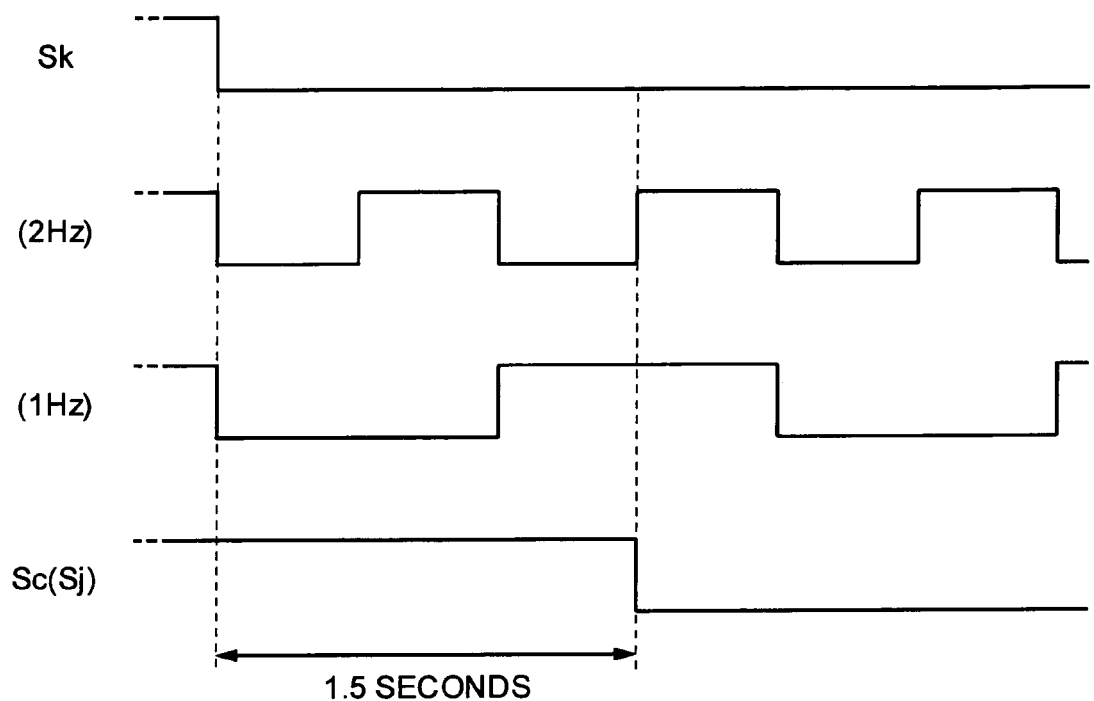
FIG. 9 is a time chart representing a behavior of the pulse synthesizing circuit according to the embodiment.

Next, an operation of the pulse synthesizing circuit 701 will be explained specifically. FIG. 9 is a time chart that represents a behavior of the pulse synthesizing circuit 701. First, when power-on reset rises by applying a voltage between the ground and the terminal Vss1, the latch circuit 804 is reset by the power-on reset circuit 802, so that the backup original signal Sc changes to high.

After 1.5 seconds pass, since the AND gate 803 receives an output from the frequency-dividing circuit 801 and outputs a high level, the latch circuit 804 is set, and the backup original signal Sc varies to a low level and the low level is held. As a result, the backup original signal Sc is a pulse signal that is kept high for 1.5 seconds.

(Explanation About Operation of Electronic Watch)

Figure 13:
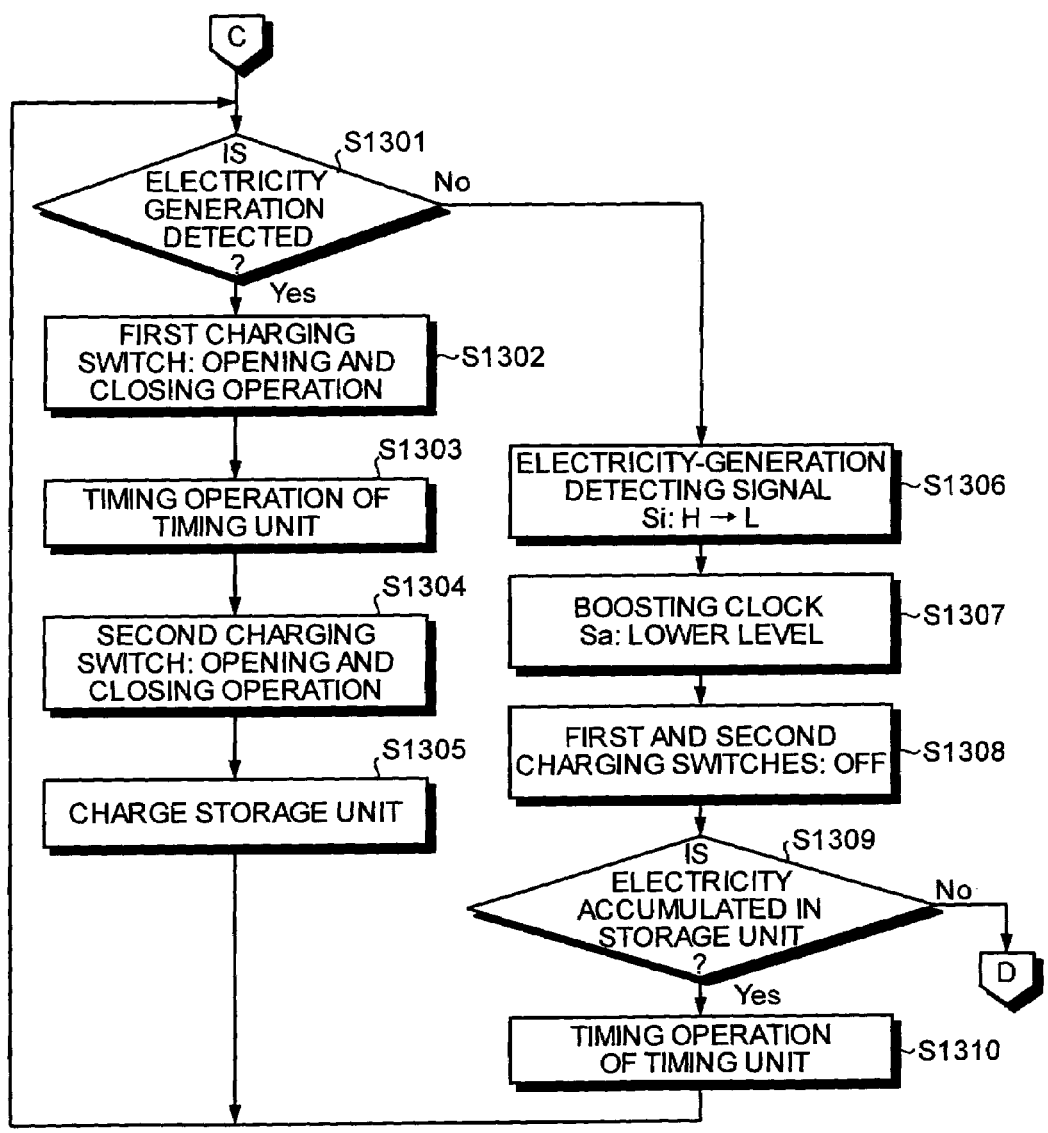
Figure 14:
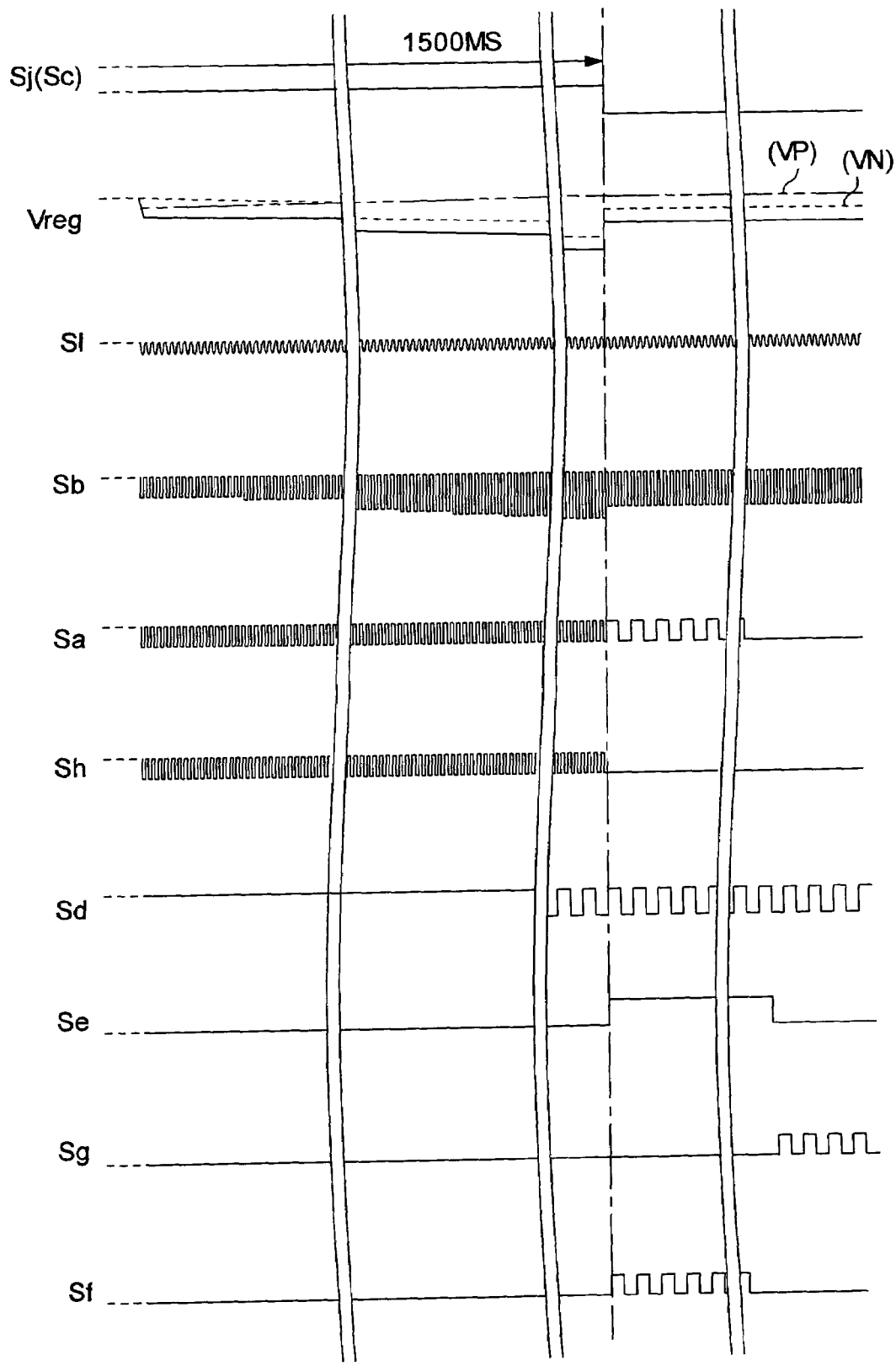
FIG. 14 is a timing chart of voltage waveforms in circuit main units of the electronic timepiece according to the embodiment.

Next, the entire operation of the electronic timepiece according to the embodiment of the present invention will be explained with reference to FIG. 10 to FIG. 14. Here, FIG. 10 to FIG. 13 are flowcharts of a processing procedure of the entire operation of the electronic timepiece according to the embodiment of the present invention. FIG. 14 is a timing chart of voltage waveforms in circuit main units in the electronic timepiece according to the embodiment of the present invention. Particularly, FIG. 14 depicts waveforms in the circuit main units when the oscillating unit 601 and units thereabout start behaviors since the electricity-generating unit 101 in a stop state of the electronic timepiece starts electricity generation, when a voltage at the terminal Vss1 rises according to a boosting behavior of the boosting unit 103 based upon the oscillation output signal S1 from the oscillating unit 601, and when the boosting behavior of the boosting unit 103 is changed to the boosting behavior based upon the boost clock Sd. Regarding the voltage values except for the oscillation output signal S1, the waveform-shaping output signal Sb, and the constant-voltage output terminal Vreg, only their logical values are simply shown on the waveform schematic shown in FIG. 14.

Here, a case that the electricity-generating unit 101 starts electricity generation from a state that the remaining amount in the storage unit 102 is empty, the electricity-generating unit 101 does not generate electricity, and the timepiece block 104 stops will be explained.

First, the first to third charging switches 111 to 113 shown in FIG. 1 are in OFF state and the electricity-generation detecting signal Si is in a low level (step S1001). When the electricity-generating unit 101 that is a solar battery receives light according to light irradiation (step S1002: Yes), the electricity-generating unit 101 starts electricity generation (step S1003).

The electricity-generation detecting unit 106 shown in FIG. 1 changes the electricity-generation detecting signal Si in the low level to a high level electricity-generation detecting signal Si, and outputs the same according to the start of electricity generation (step S1004).

A current outputted from the electricity-generating unit 101 via the first diode 121 is stored in the capacitor 110 as charges according to the start of electricity generation. An open voltage of the electricity-generating unit 101 is set to be about 0.4 voltage.

The power source voltage (the voltage at the terminal Vss1) goes down to 0.3 voltage due to a voltage drop of the first diode 121. At that time, the backup signal Sj becomes a high level (the ground potential) (step S1005), and the pull-down switch 654 is put in an approximately current-flowing state (step S1006).

Thereby, the voltage value at the constant-voltage output terminal Vreg reaches the voltage value of the power source voltage (the voltage at the terminal Vss1). That is, both the voltage value at the power source voltage (the voltage at the terminal Vss1) and at the constant-voltage output terminal Vreg become 0.3 voltage.

When the voltage at the terminal Vreg that is the operating power source, namely, the power source voltage (the voltage at the terminal Vss1) in this state becomes a voltage equal to or more than the threshold of its own MOSFET (step S1007: Yes), the bias circuit 604 starts behavior (step S1008).

A predetermined voltage is outputted from the bias circuit 604, so that the first bias voltage VP becomes a potential lower than the ground potential by 0.3 voltage and the second bias voltage VN becomes a potential higher than the terminal Vreg by 0.3 voltage.

Subsequently, an operation that the electronic timepiece 100 starts after the electricity-generating unit 101 starts electricity generation will be explained. When a predetermined voltage is outputted from the bias circuit 604, the oscillating unit 601 oscillates with a fixed oscillating operating-point (step S1101). That is, a voltage approximating to the threshold voltage is biased to the gate terminal of the transistor element constituting the oscillating unit 601 in a direct current manner.

Therefore, an amplifying rate in the transistor element becomes the maximum, and the oscillating inverter 620 in the oscillating unit 601 can operate as an amplifier even from about 0.3 voltage. Further, since the oscillation output signal Si is fed back to the input side (via the first and second coupling capacitances 623 and 624 in a alternating current manner) via the resonating circuit 610 again, the oscillating unit 601 starts an oscillating operation at 32 kilohertz which is the resonating frequency of the resonating circuit 610. The oscillation output signal S1 becomes substantially a sine wave.

A consumption current at the oscillating unit 601 is determined by the constant current circuit constituted of the third transistor element 627, and it can be suppressed to about 20 nanoamperes that is the set value. The oscillating unit 601 performs a stable behavior without causing overtone oscillation. A voltage between the terminals of the stabilizing capacitance 629 becomes about 0.3 voltage during the oscillating operation.

The waveform shaping unit 603 starts a stable amplifying operation with a fixed operating-point (step S1102). That is, a voltage approximating to the threshold voltage is biased to the gate terminal of the transistor element constituting the waveform shaping unit 603 in a direct current manner. Therefore, the amplifying rate of the transistor element becomes the maximum, and the waveform shaping unit 603 can operate as an amplifier even from about 0.3 voltage.

Further, since the oscillation output signal S1 is applied to the gate terminal via the third coupling capacitance 633 and the fourth coupling capacitance 634 in an alternating current manner, a waveform-shaping output signal Sb obtained by reversing the oscillation output signal S1 and amplifying the amplitude thereof up to a voltage between the ground and the terminal Vreg is outputted (step S1103).

Further, the waveform-shaping output signal Sb is fed to the second AND gate 715 via the first NAND gate 711 constituted of the CMOS with a low threshold. The control-signal generating unit 107 generates a boosting clock Sa, and outputs the same to the boosting unit 103 (step S1104).

The boosting unit 103 receives the boosting clock Sa and starts a boosting operation for a power source voltage (a voltage at the terminal Vss 1) applied from the electricity-generating unit 101 based upon the boosting clock Sa (step S1105). That is, the boosting unit 103 performs a switching operation from a serial connection to a parallel connection of the capacitors 311 to 313 inside the boosting unit 103 according to 32 kilohertz that is the oscillating frequency of the oscillating unit 601.

The waveform-shaping output signal Sb is fed to the fifth AND gate 719 via the first NAND gate 711. Thereby, the control-signal generating unit 107 generates a third charging-switch signal Sh formed in a square wave according to amplification of a NOT signal of the waveform-shaping output signal Sb, and outputs the same to the switching control unit 108 (step S1106).

The third charging switch 113 receives the third charging-switch signal Sh, and performs an opening and closing operation in synchronization with the boosting operation performed by the boosting unit 103 (step S1107). Thereby, the third charging switch 113 operates to feed a boosting output to the timepiece block 104 (step S1201). At that time, the pulse synthesizing circuit 701 and the motor driver 702 that are each constituted of a MOSFET with a high threshold voltage, and the like do not operate.

When the boosting unit 103 continues the boosting operation, the power source voltage (the voltage at the terminal Vss1) increases. Since the pull-down switch 654 is maintained in a conductive state during high level of the backup signal Sj, the voltage at the constant-voltage output terminal Vreg remains at the same voltage as the power source voltage (the voltage at the terminal Vss1).

The power source voltage (the voltage at the terminal Vss1) rises up to about 1.6 voltages which is four times the electricity generation voltage. When the power source voltage (the voltage at the terminal Vss1) is boosted to the operating voltage of the timing unit 605 (for example, 1.2 voltages) or more (step S1202: Yes), a behavior of the pulse synthesizing circuit 701 starts (step S1203).

Consequently, the pulse synthesizing circuit 701 can perform frequency-dividing and pulse synthesizing operation, and thereby outputs a boosting clock Sd and a charging clock Se (step S1204). When 1.5 seconds passes after the oscillating unit 601 starts the behavior (step S1205: Yes), the backup signal Sj (namely, the backup original signal Sc) falls from the high level to a low level (step S1206).

When the backup signal Sj falls down to the low level, the pull-down switch 654 changes to be in a non-conductive state (step S1207). Thereby, the voltage value from the constant-voltage output terminal Vreg switches to the predetermined constant voltage value. The voltage value from the constant-voltage output terminal Vreg does not reach the predetermined constant-voltage value or more due to the constant voltage behavior of the constant voltage circuit 653, even if the power source voltage (the voltage at the terminal Vss1) increases.

After 1.5 seconds pass after the oscillating unit 601 starts the behavior, when the electricity-generation detecting unit 106 detects electricity generation (step S1301: Yes), the electricity-generation detecting signal Si holds its high level. Accordingly, the boosting signal Sd is fed to the third AND gate 717 and the fourth AND gate 718 via the first AND gate 712 and the second level shifter 713.

Thereby, the boosting signal Sd appears at the first charging-switch signal Sf and the second charging-switch signal Sg every 500 milliseconds, and the first charging-switch signal Sf and the second charging-switch signal Sg are outputted.

The first charging-switch signal Sf is inputted to the first charging switch 111, so that the first charging switch 111 performs an opening and closing operation (step S1302). Thereby, a boosted output is outputted from the boosting unit 103 to the timepiece block 104, so that the timepiece block 104 performs a timing behavior (step S1303).

The second charging-switch signal Sg is inputted in the second charging switch 112, so that the second charging switch 112 performs an opening and closing behavior (step S1304). Thereby, a boosted output is outputted from the boosting unit 103 to the storage unit 102, so that the storage unit 102 performs a charging behavior (step S1305). Thereafter, the processing returns back to step S1301.

That is, the boosted output outputted from the boosting unit 103 is distributed to the timepiece block 104 and the storage unit 102 by the first charging switch 111 and the second charging switch 112, so that a timing behavior of the timing block 104 and a charging behavior of the storage unit 102 can be performed in parallel.

Since the electricity-generation detecting unit 106 detects the electricity-generating state of the electricity-generating unit 101 and the boosting unit 103 performs the boosting behavior in this manner while the electricity-generating unit 101 is in the electricity-generating state, charging to the storage unit 102 is performed while performing a clock time display.

On the other hand, when electricity generation is not detected (step S1301: No), the electricity-generating unit 101 is in a non-generation state and the generation detecting signal Si changes to a low level. (step S1306). Thereby, the boosting clock Sa changes to a low level (step S1307), and outputs of the first charging-switch signal Sf and the second charging-switch signal Sg stop, so that opening and closing behaviors of the first charging switch 111 and the second charging switch 112 are stopped (step S1308). Thereby, the boosting unit 103 stops the boosting behavior.

When electric energy is once stored in the storage unit 102 (step S1309: Yes), discharging is performed from the storage unit 102 to the timepiece block 104, so that the timing unit 605 performs a timing behavior (step S1310). Thereafter, the processing returns back to step S1301. Thereby, even if the electricity-generating unit 101 is in the non-generating state, the timepiece block 104 can continue the timing operation.

That is, according to the electronic timepiece 100 according to the embodiment, the boosting unit 103 can forcibly perform a boosting output to the timing unit 104 for 1.5 seconds corresponding to the predetermined period just after the oscillation actuation of the electronic timepiece 100, and perform a boosting output according to presence/absence of electricity generation subsequently thereto.

(Another Example of Waveform Producing Unit)

In the above-described embodiment, although a period while the boosting unit 103 operates is fixed to a predetermined time, which is 1.5 seconds after starting of the oscillating unit 601, the boosting unit 103 may continuously operate until the voltage between the terminals of the timepiece block 104 rises sufficiently to actuate the electronic timepiece 100 more safely.

Figure 15:
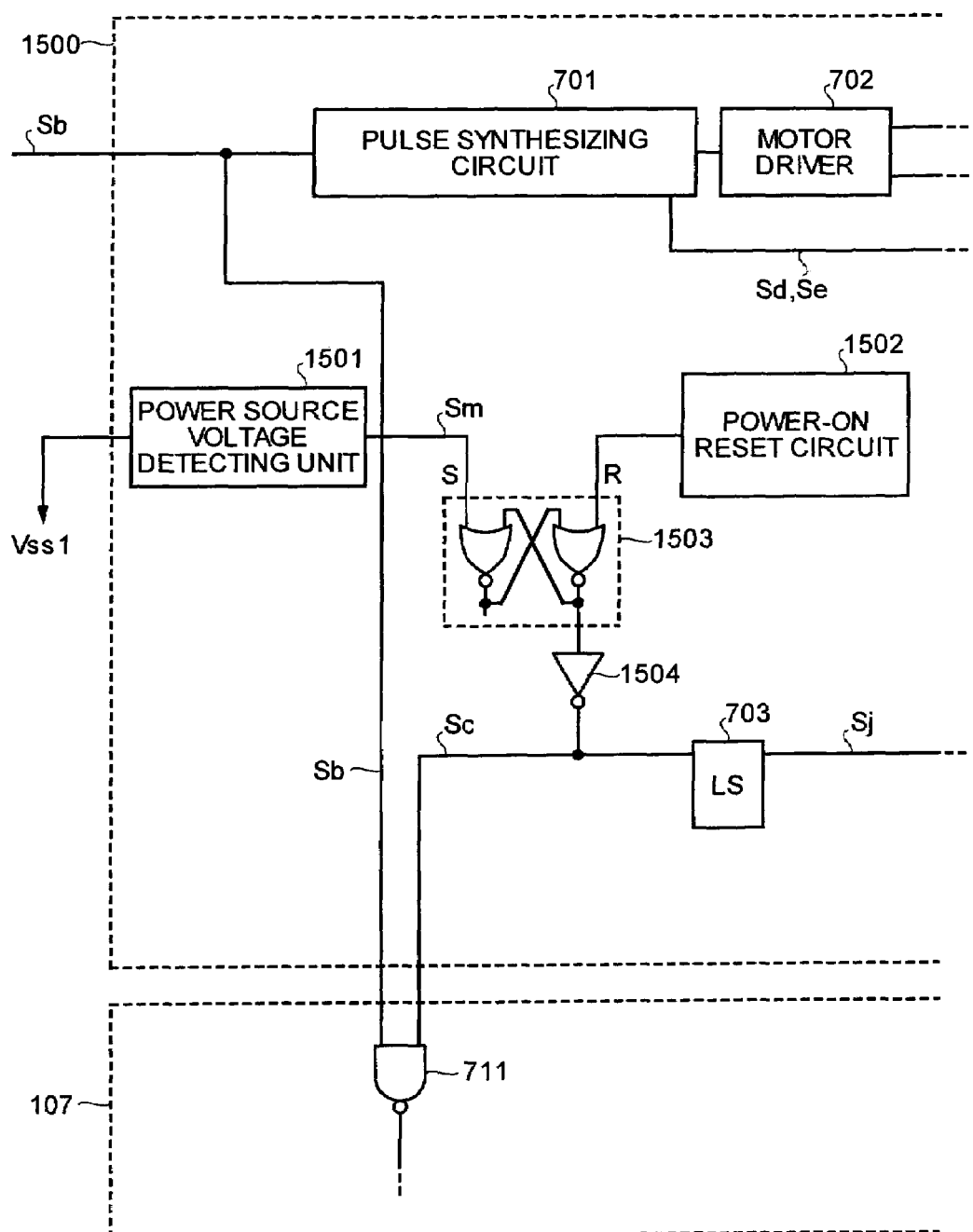
FIG. 15 is a schematic of another example of a waveform generating unit according to the embodiment.

Another example of the waveform generating unit in the electronic timepiece 100 in that case will be explained. FIG. 15 is a block diagram of the another example of the waveform generating unit. In FIG. 15, same constitutions as those in the above embodiment are attached with same reference numerals and explanation thereof is omitted.

As shown in FIG. 15, a waveform generating unit 1500 includes the pulse synthesizing circuit 701, the motor driver 702, the level shifter 703 shown in FIG. 7, and moreover, a power-source voltage detecting unit 1501, a power-on reset circuit 1502, a latch circuit 1503, and an inverter 1504. These units 1501, 1502, 1503, and 1504 can be each constituted of a MOSFET with the same threshold as that in the pulse synthesizing circuit 701.

The power-on reset circuit 1502 is a circuit that outputs a power-on reset signal that changes to a low level after outputting a high level (the ground potential) for several microseconds, when the circuit itself is powered on.

The power-source voltage detecting unit 1501 is an ordinary voltage detecting circuit that determines whether an input voltage is less than a predetermined voltage. Here, as the power-source voltage detecting unit 1501, a unit that outputs a low level when a voltage applied to the timepiece block 104 is less than 1.2 voltages, otherwise outputs a high level is used. An output signal from the power-source voltage detecting unit 1501 is represented as a power-source voltage detecting signal Sm.

The latch circuit 1503 is an ordinary latch circuit that is constituted of two NOR gates. A signal outputted from the power-on reset circuit 1502 is inputted to a reset input of the latch circuit 1503 while the power-source voltage detecting signal Sm is inputted to a set input thereof.

An output signal from the latch circuit 1503 is inputted in the inverter 1504 to generate a NON signal of an output signal of the latch circuit 1503. An output signal from the inverter 1504 is inputted in the NAND gate 711 or the first level shifter 703 as the backup original signal Sc shown in the embodiment.

Figure 10:
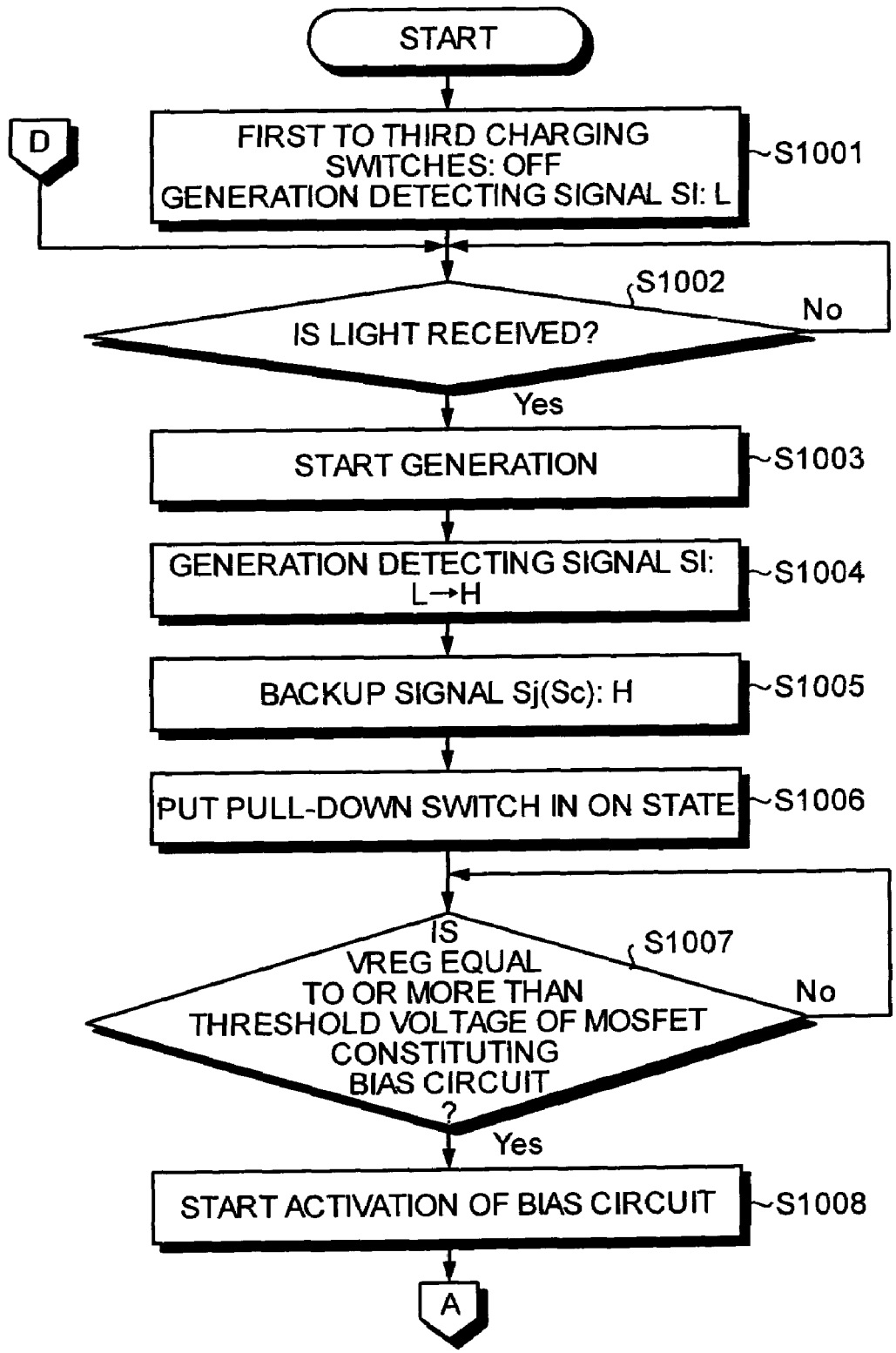
FIG. 10 to FIG. 13 are flowcharts of an actuation processing of the electronic timepiece according to the embodiment.
Figure 11:
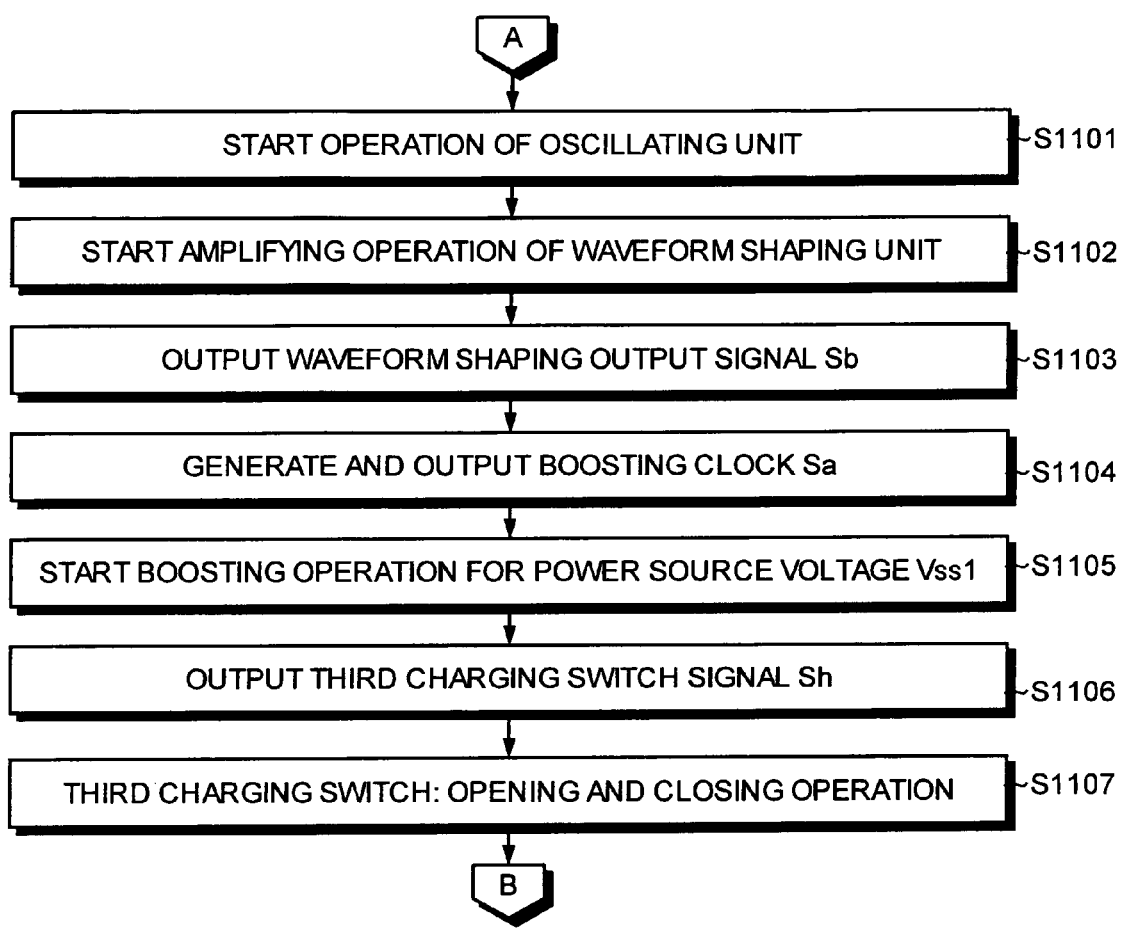
Figure 12:
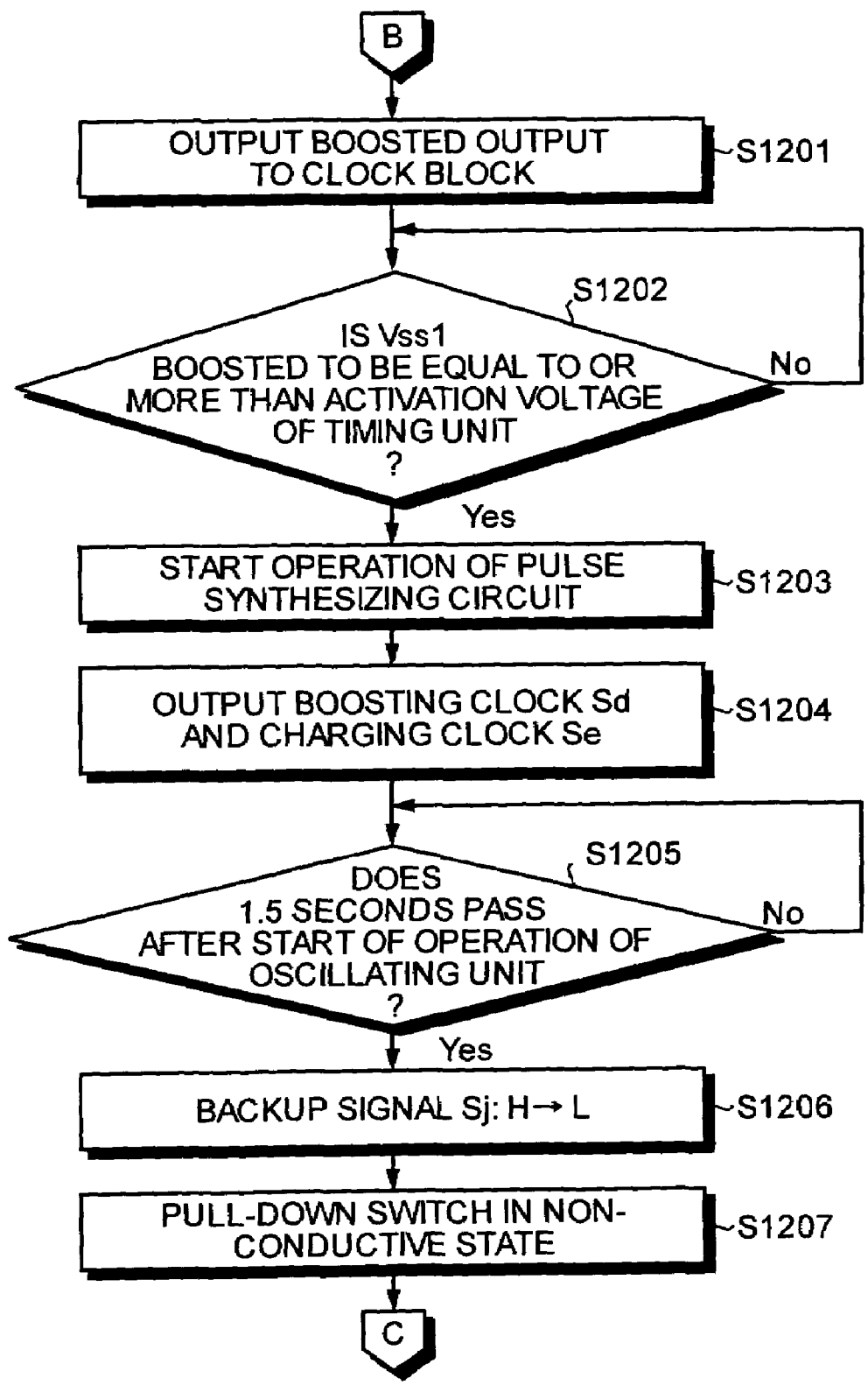
Figure 16:
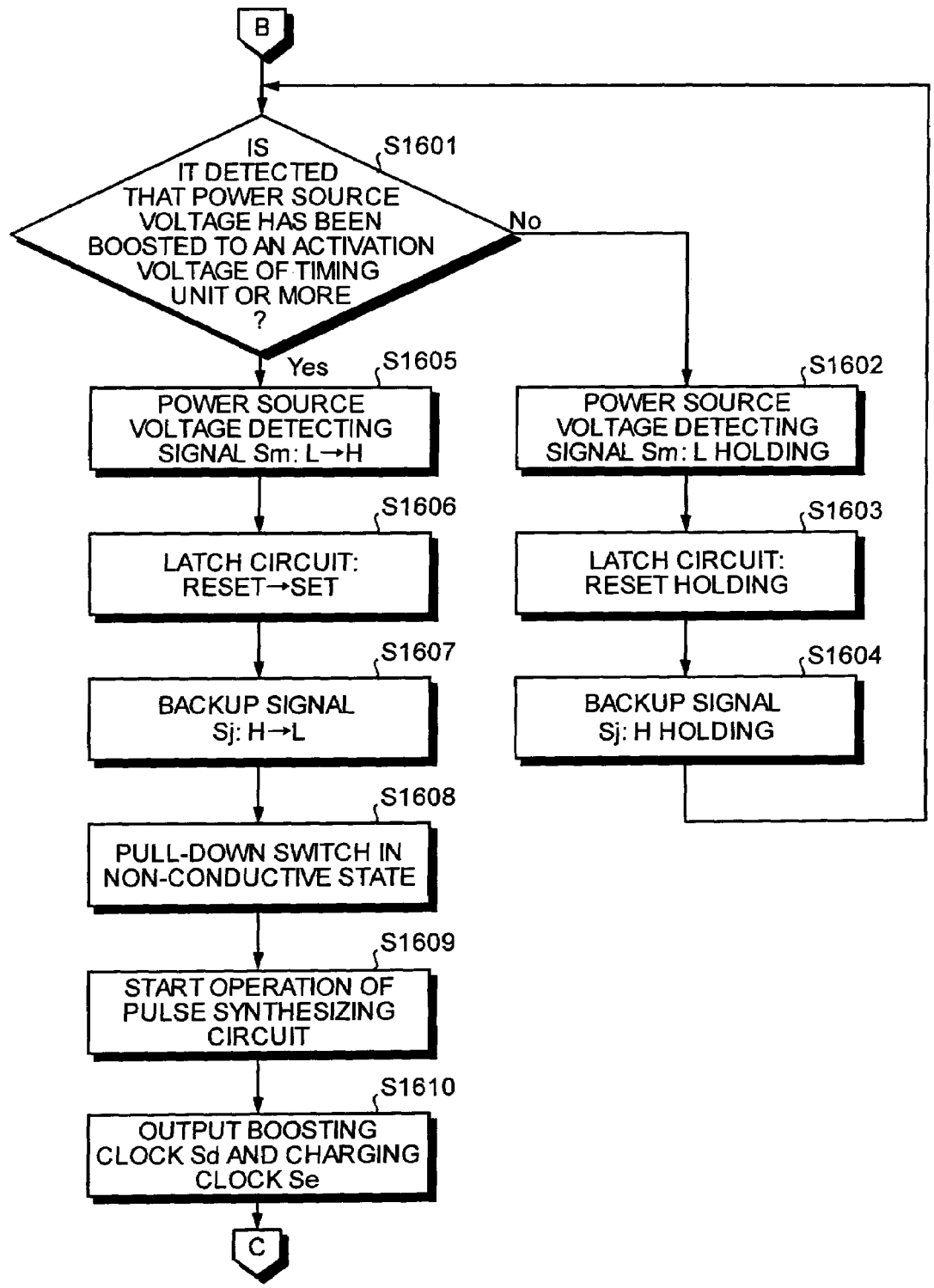
FIG. 16 is a flowchart of an actuation processing of the electronic timepiece when the waveform generating unit shown in FIG. 15 is used.
Figure 17:
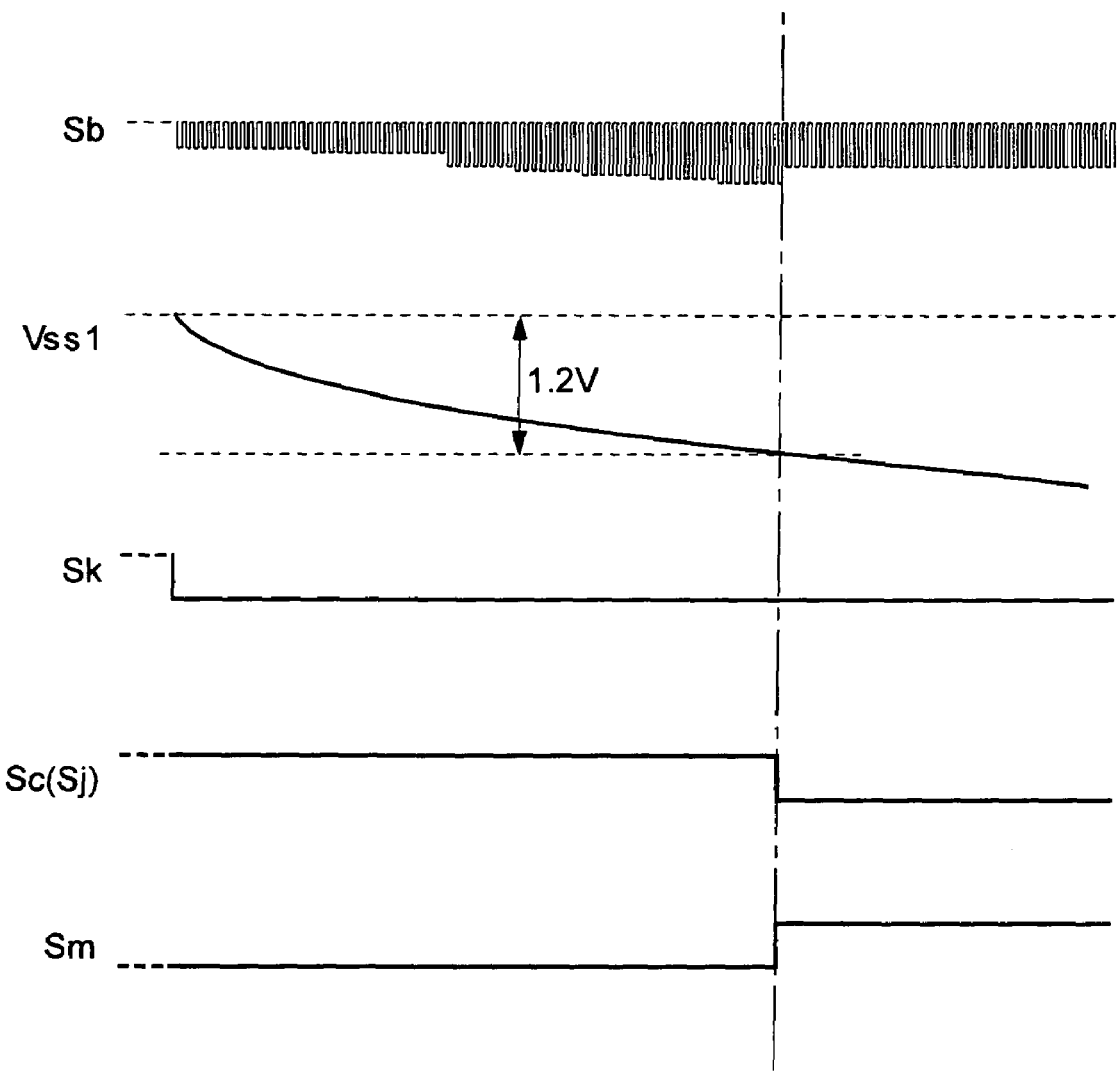
FIG. 17 is a timing chart of voltage waveforms in circuit main units in the electronic timepiece when the waveform generating unit shown in FIG. 15 is used.

Subsequently, an actuation processing of the electronic timepiece 100 where the waveform generating unit 1500 is used will be explained. FIG. 16 is a flowchart of a processing procedure of a behavior of the electronic timepiece 100 where the waveform generating unit 1500 is used. FIG. 17 is a timing chart of voltage waveforms at circuit main units in the electronic timepiece 100 where the waveform generating unit 1500 is used. Since the actuation processing procedure shown in FIG. 10, FIG. 11, and FIG. 13 are common to this actuation processing procedure, explanation thereof will be omitted.

As shown in FIG. 16, first, when the power source voltage (the voltage at the terminal Vss1) is not boosted to be equal to or more than the activation voltage (for example, 1.2 voltages) of the timing unit 605 (step S1601: No), the power-source voltage detecting signal Sm holds a low level (step S1602). Therefore, since the latch circuit 1503 holds a reset state, too (step S1603), the backup signal Sj holds its high level (step S1604), and boosting to the capacitor 110 and the timing block 104 are continued. The processing returns back to step S1601.

On the other hand, when the power source voltage (the voltage at the terminal Vss1) is boosted to be equal to or more than the activation voltage (for example, 1.2 voltages) of the timing unit 605 (step S1601: Yes), the power-source voltage detecting signal Sm switches from a low level to a high level (step S1605). Therefore, the latch circuit 1503 also switches from a reset state to a set state (step S1606), and the backup signal Sj falls from the high level to the low level (step S1607).

The backup signal Sj with the low level is inputted to pull-down switch 654, so that the pull-down switch 654 changes to be in a non-conductive state (step S1608). Thereby, the boosting behavior stops.

That is, the electronic timepiece 100 operates such that the boosting unit 103 forcibly performs a boosting output to the timepiece block 104 until the terminal voltage of the timepiece block 104 reaches 1.2 voltages corresponding to a predetermined voltage value just after oscillation actuation of the electronic timepiece 100 and performs a boosting output according to presence/absence of electricity generation subsequently thereto.

Thereafter, a behavior of the pulse synthesizing circuit 701 starts (step S1609). Consequently, the pulse synthesizing circuit 701 can perform frequency dividing and pulse synthesizing behavior, and thereby outputs the boosting clock Sd and the charging clock Se (step S1610). The processing proceeds to step S1301 shown in FIG. 13, where the boosting unit 103 can perform a boosting behavior according to a generating state of the electricity-generating unit 101.

That is, the electronic timepiece 100 operates such that the boosting unit 103 forcibly performs a boosting output to the timepiece block 104 until the terminal voltage at the timepiece block 104 reaches 1.2 voltages corresponding to the predetermined voltage value just after oscillation actuation of the oscillating unit 601 and performs a boosting output according to presence/absence of electricity generation thereafter.

According to this example, especially, the timepiece block 104 can cause the electronic timepiece to perform actuation behavior safely without causing a malfunction due to a low voltage even under such an environment that a generated current obtained from the electricity-generating unit 101 is insufficient and it takes time to boost the terminal voltage of the timepiece block 104.

(Another Configuration Example of Waveform Generating Unit and Control-Signal Generating Unit)

Next, another configuration example of the waveform generating unit and the control-signal generating unit will be explained. In the configuration example, the timer function for a predetermined time (1.5 seconds) that performs a boosting behavior in the above embodiment is not provided in the waveform generating unit but it is provided in the control-signal generating unit independently of the waveform generating unit.

Figure 18:
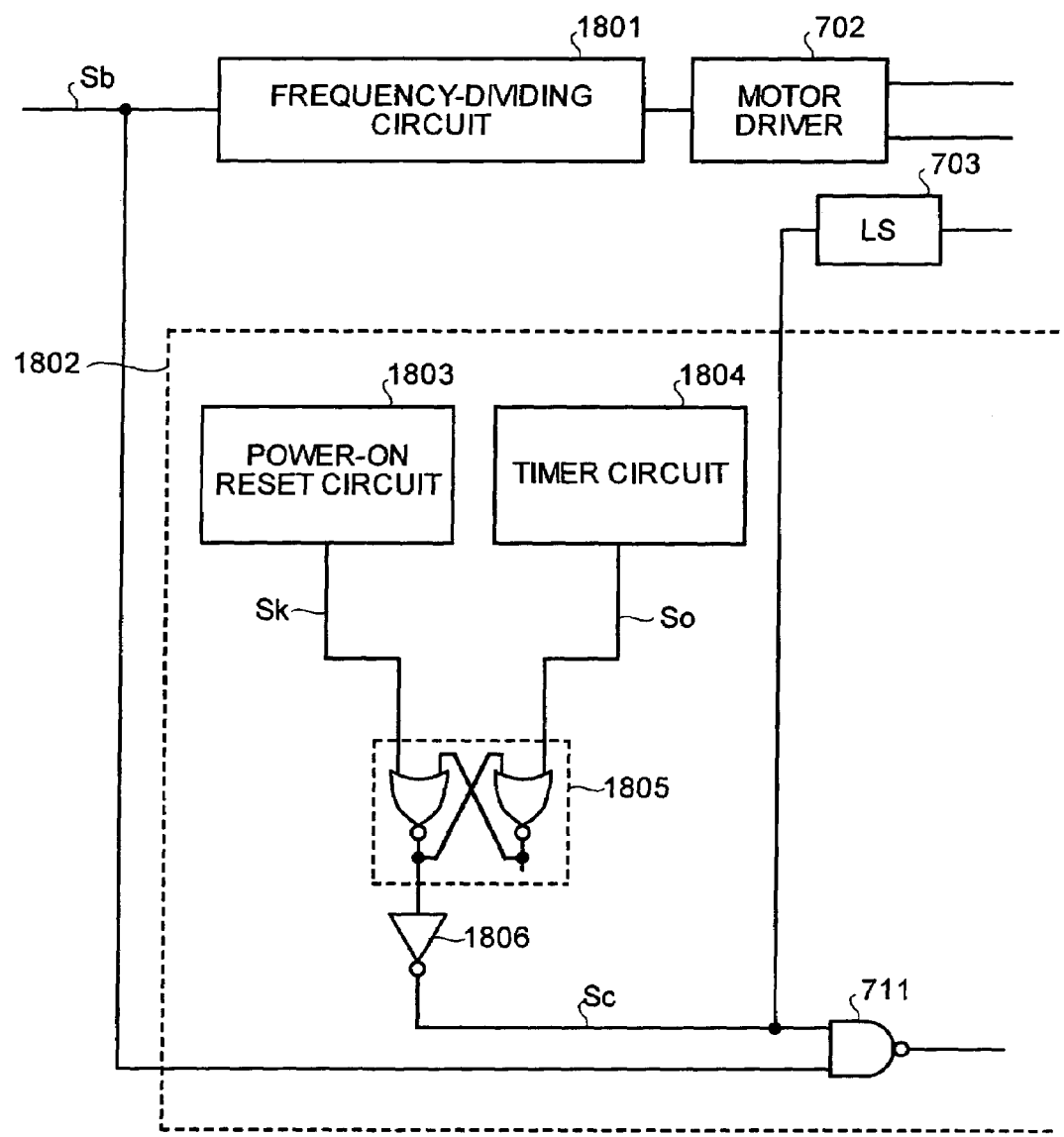
FIG. 18 is a schematic of another configuration example of the waveform generating unit and the control-signal generating unit according to the embodiment.
Figure 19:
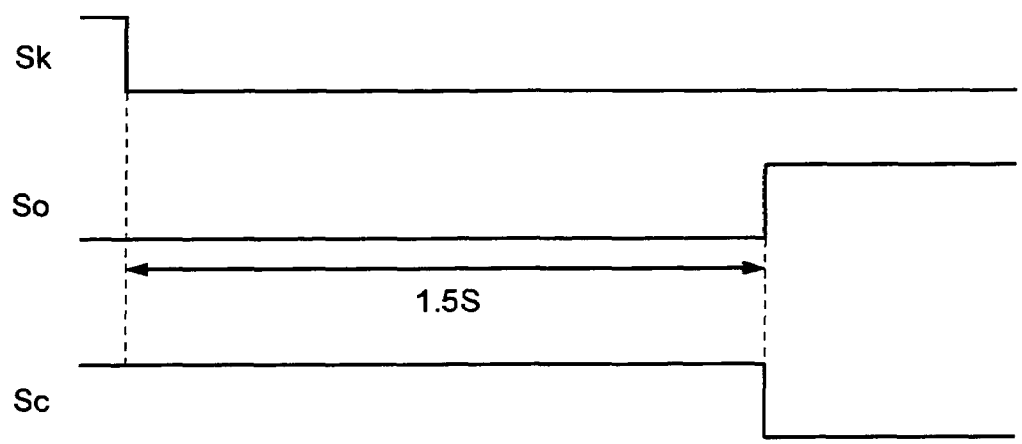
FIG. 19 is a time chart of a timer function provided in the control-signal generating unit shown in FIG. 18.

FIG. 18 is a block diagram of another configuration example of the waveform generating unit and the control-signal generating unit, and FIG. 19 is a time chart of a timer function provided in the control-signal generating unit shown in FIG. 18. In FIG. 18, same constitutions as those in the above embodiment are attached with same reference numerals and explanation thereof is omitted. Since an internal configuration of a control-signal generating unit 1802 that is not shown in FIG. 18 is the same as that of the control-signal generating unit 107 (see FIG. 7) of the above-described embodiment, explanation thereof is omitted here.

A frequency-dividing circuit 1801 shown in FIG. 18 is a counter circuit constituted of a flip-flop train of 15 stages or more like the frequency-dividing circuit 801 shown in FIG. 8. The frequency-dividing circuit 1801 frequency-divides a waveform-shaping output signal Sb outputted from the waveform shaping unit 603 shown in FIG. 6, and outputs the same to the motor driver 702.

The frequency-dividing circuit 1801 outputs a boosting signal Sd and a charging clock Se. On the other hand, the frequency-dividing circuit 1801 does not output, to the control-signal generating unit 1802, a pulse signal with 1 hertz and a pulse signal with 2 hertz for generating a backup original signal Sc that serves as a reference for a boosting behavior.

A power-on reset circuit 1803 is a circuit that outputs a power-on reset signal that changes to a low level after outputting a high level (a ground potential) for a several microseconds, when the circuit itself is powered on.

A timer circuit 1804 serving as a boosting-stop-instruction-signal output unit is a circuit that outputs a timer signal So that changes to a high level after outputting a low level for 1.5 seconds after powered on. A latch circuit 1805 is constituted of a logic gate through which a logical signal passes or which holds the logical signal when a power-on reset signal is reset-inputted and a timer signal So is set-inputted.

According to this configuration, when a voltage is applied between the ground and the terminal Vss1, as shown in FIG. 19, the latch circuit 1805 is reset by a power-on reset signal from the power-on reset circuit 1803, and the backup original signal Sc changes to a high level by the inverter 1806.

On the other hand, since the timer circuit 1804 outputs a high level after 1.5 seconds pass, the latch circuit 1805 is set and the backup original signal Sc falls to a low level in the inverter 1806 and holds the low level. As a result, the backup original signal Sc changes to a pulse signal that holds a high level for 1.5 seconds.

According to this configuration, since the timer circuit that stops the boosting behavior is configured separately from the frequency-dividing circuit 1801, an output timing of the timer signal So can be changed by only a timer circuit replacement, and a stopping time of the boosting behavior at a time of actuation can be changed for each electronic timepiece.

(Another Configuration Example of Boosting-Stop-Instruction-Signal Output Unit)

Figure 20:
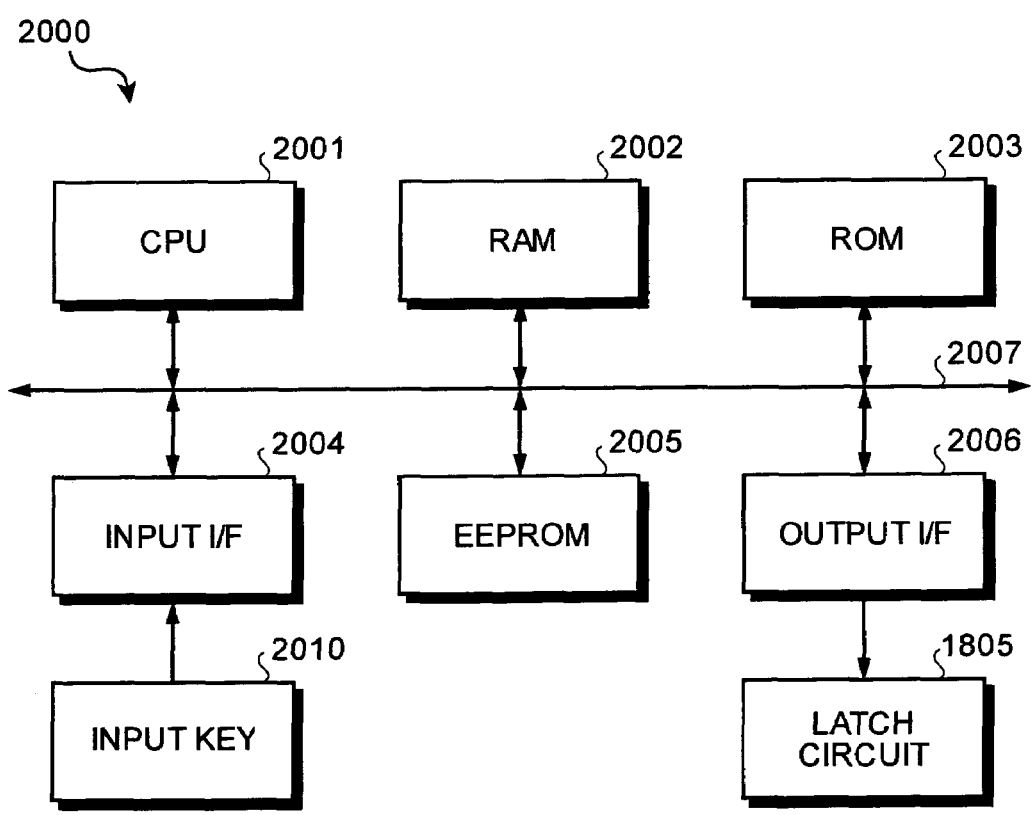
FIG. 20 is a schematic showing a hardware configuration of a boosting-stop-instruction-signal output unit that changes a predetermined time according to the embodiment.

Next, a case that the configuration of the timer circuit 1804 shown in FIG. 18 is replaced by a configuration where the predetermined time set in the timer circuit 1804 can be changed will be explained. FIG. 20 is a schematic of a hardware configuration of a boosting-stop-instruction-signal output unit where a predetermined time is changed.

As shown in FIG. 20, in a boosting-stop-instruction-signal output unit 2000, a CPU 2001, a RAM 2002, a ROM 2003, an input interface (I/F) 2004, an EEPROM 2005 that is a non-volatile memory, and an output interface (I/F) 2006 are connected via a bus 2007.

The CPU 2001 controls the whole boosting-stop-instruction-signal output unit 2000. The CPU 2001 is driven with a low voltage, and, for example, it is actuated by the negative terminal Vss1 (the voltage between the ground and the terminal Vss1) of the timepiece block 104.

The RAM 2002 is used as a work area in the CPU 2001. The ROM 2003 stores a program for executing the timer processing or the like. The input I/F 2004 inputs time information obtained according to operation of an input key 2010. The input key 2010 is configured of a selector-type switch or button that allows selection of time information elements that represents, for example, four kinds of time intervals such as 0.5 second, 1.0 second, 1.5 seconds, or 2.0 seconds.

The inputted time information is written to the EEPROM 2005. When the time information elements are constituted of four kinds of elements, the EEPROM 2005 can be constituted of 2 bits or so. A flash memory may be used instead of the EEPROM 2005. The output I/F 2006 outputs a boosting stop instruction signal generated to the latch circuit 1805 shown in FIG. 18.

Figure 21:
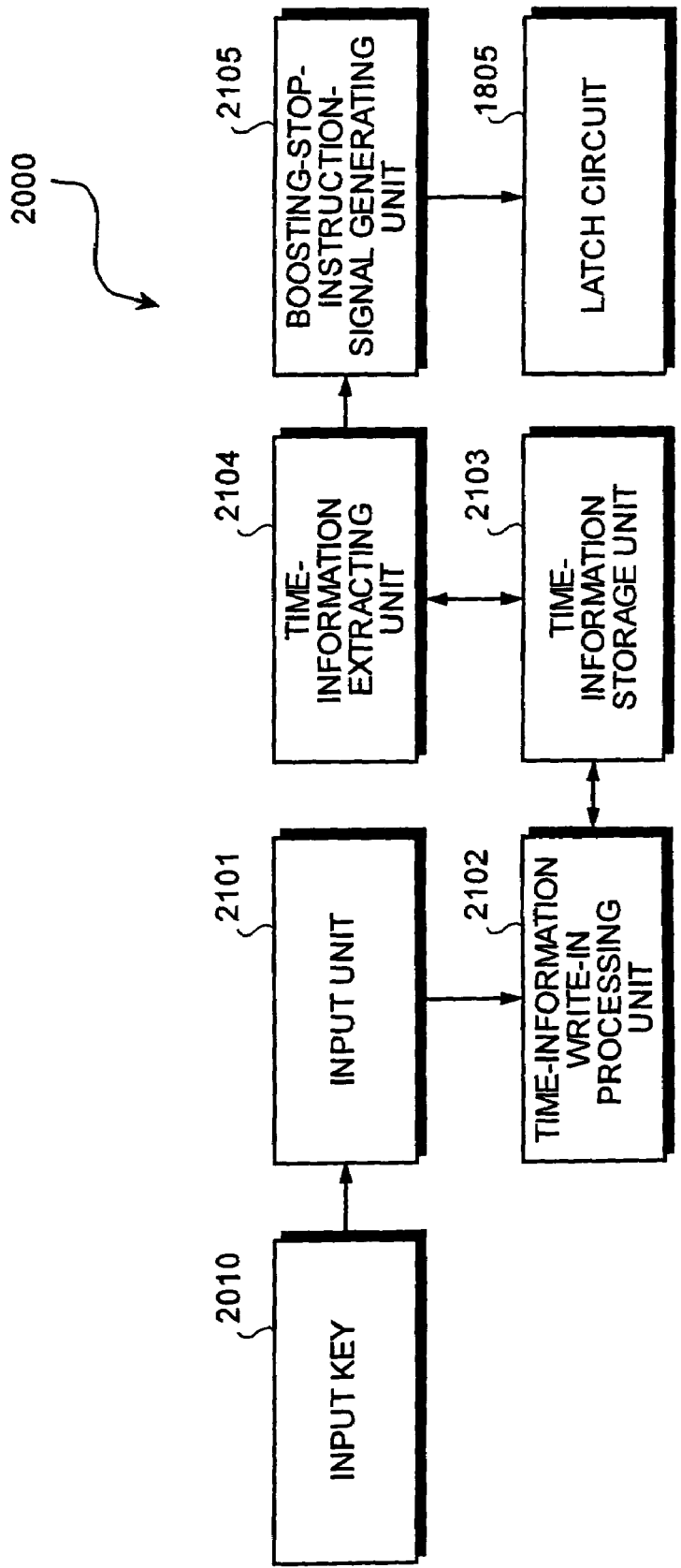
FIG. 21 is a schematic showing of a functional configuration of the boosting-stop-instruction-signal output unit shown in FIG. 20.

Next, a functional configuration of the boosting-stop-instruction-signal output unit 2000 shown in FIG. 20 will be explained. FIG. 21 is a schematic of the boosting-stop-instruction-signal output unit shown in FIG. 20.

The input unit 2101 inputs either one of the time information elements selected according to operation of the input key 2010.

Specifically, the input unit 2101 realizes its function through the input I/F 2004 shown in FIG. 20.

The time-information write-in processing unit 2102 writes a time information element inputted through the input unit 2101 in a time-information storage unit 2103. At that time, the time information piece stored previously is erased. Specifically, the time-information write-in processing unit 2102 realizes its function, for example, through the CPU 2001 executing a program stored in the ROM 2003 shown in FIG. 20.

The time-information storage unit 2103 stores the time information element written by the time-information write-in processing unit 2102. Specifically, the time-information storage unit 2103 realizes its function, for example, through the EEPROM 2005 shown in FIG. 20.

The time-information extracting unit 2104 extracts the time information element stored in the time-information storage unit 2103 when the CPU 2001 is actuated. Specifically, the time-information extracting unit 2104 realizes its function, for example, through the CPU 2001 executing a program stored in the ROM 2003 shown in FIG. 20.

The boosting-stop-instruction-signal generating unit 2105 generates a boosting stop instruction signal corresponding to the time interval of a time information element extracted by the time-information extracting unit 2104, and outputs the same to the latch circuit 1805. The boosting stop instruction signal almost corresponds to the timer signal So shown in FIG. 19, but a rising time thereof varies for each time information element.

For example, when the time information element indicates 0.5 second, a time required for completion of rising of a boosting stop instruction signal takes 0.5 second. Specifically, the boosting-stop-instruction-signal generating unit 2105 realizes its function, for example, through the CPU 2001 executing a program stored in the ROM 2003 shown in FIG. 20.

Figure 22:
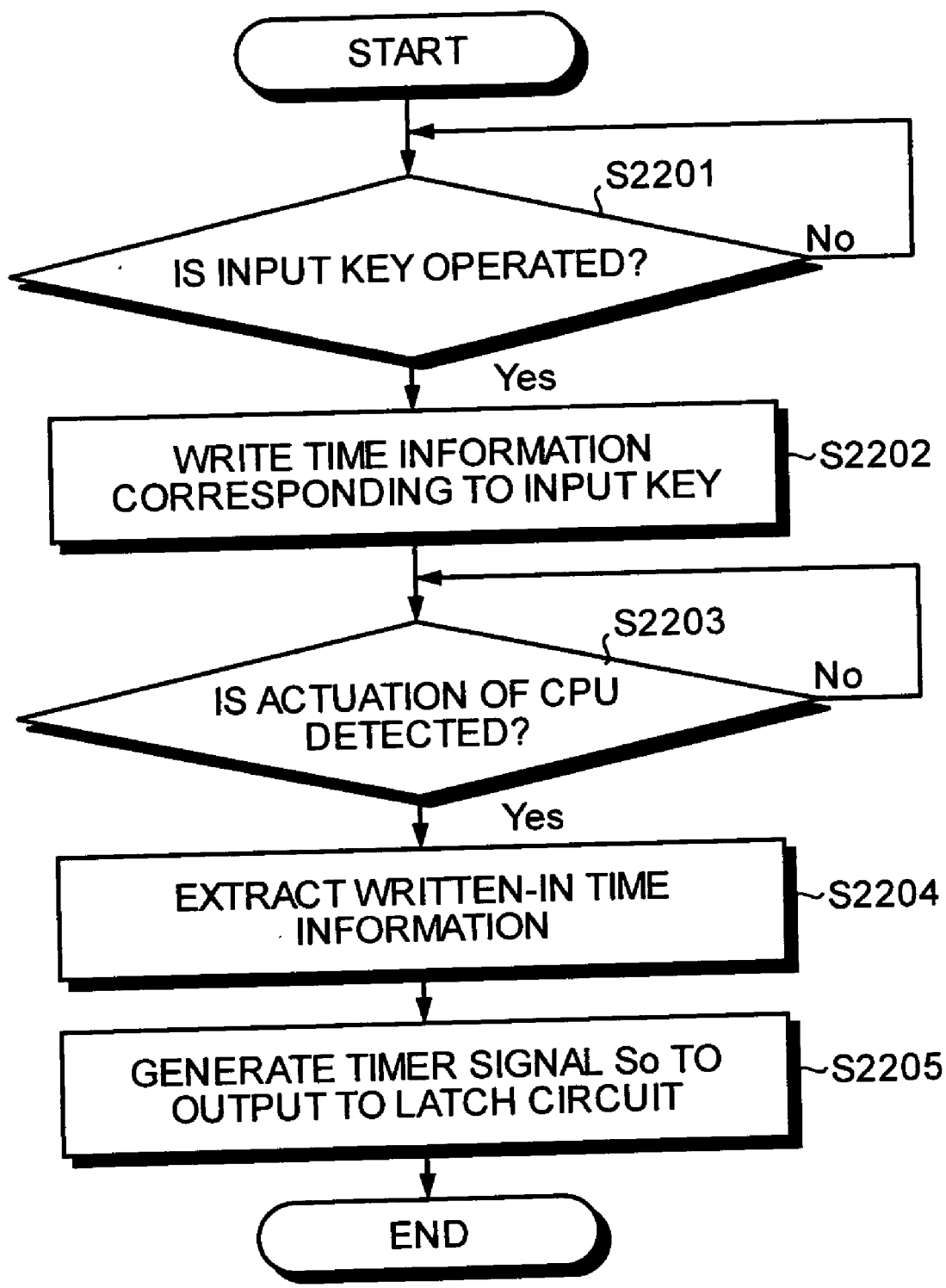
FIG. 22 is a flowchart of a boosting-stop-instruction-signal output processing performed in the boosting-stop-instruction-signal output unit.
Figure 23:
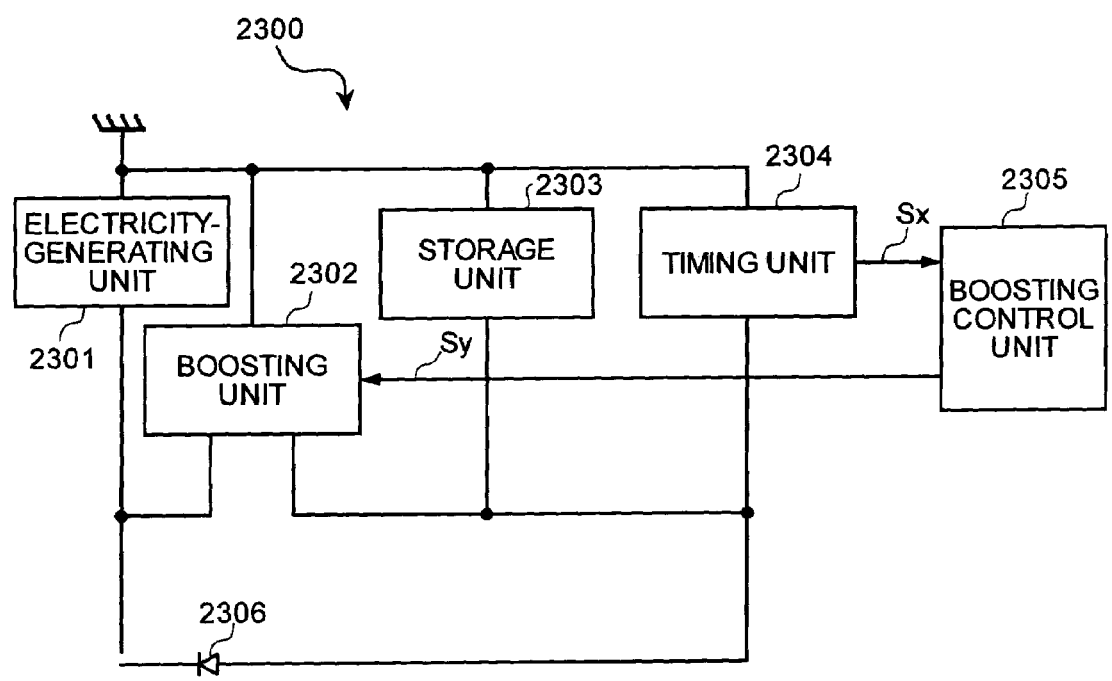
FIG. 23 is a schematic of a conventional electronic timepiece.

Next, a boosting-stop-instruction-signal output processing procedure of the boosting-stop-instruction-signal output unit 2000 will be explained. FIG. 22 is a flowchart of a boosting-stop-instruction-signal output processing procedure of the boosting-stop-instruction-signal output unit 2000.

As shown in FIG. 22, when the input key 2010 is operated (step S2201: Yes), a time information element selected according to operation of the input key 2010 is written in the time-information storage unit 2103 (step S2202).

When the electricity-generating unit 101 starts electricity generation from a state that the remaining amount in the storage unit 102 is empty, the electricity-generating unit 101 does not generate electricity, and the timepiece block 104 stops, the CPU 2001 is actuated. When the actuation is detected (step S2203: Yes), a time information element stored in the time-information storage unit 2103 is extracted (step S2204).

A timer signal So is generated based on the boosting stop instruction signal from the extracted time information element, and is outputted to the latch circuit 1805 (step S2205). When 1.5 seconds are set in a plurality of kinds of electronic timepiecees during manufacture thereof without exception, change of a predetermined time can be performed at a shipping time or at the time of delivery, a change processing on a predetermined time serving as a reference for a boosting behavior can be performed according to an effective light receiving area of the electricity-generating unit 101 based upon a size or a design of each electronic timepiece, and a stable actuation can be performed according to the kind of an electronic timepiece.

For example, since an electronic timepiece for a woman is smaller in size than an electronic timepiece for a man, the former solar battery, which is the electricity-generating unit 101, is also smaller than the latter one and the former effective light-receiving area is also smaller than the latter one. However, by performing such a setting that the time interval of the predetermined time serving as a reference to the boosting behavior becomes long, even if the solar battery is in a non-generating state or in an uncharged state, stable actuation can be performed.

Thus, in the electronic timepiece 100 according to the embodiment, a crystal oscillating circuit itself can start oscillation when a low electricity generation voltage such as 0.4 voltage, which is lower than that of one stage in the solar battery, is applied. Thereby, the solar battery can be reduced in size, and the electronic timepiece 100 can be reduced in size. Particularly, even the electronic timepiece 100 for a woman smaller in size than the electronic timepiece for a man can be actuated with a low-voltage electricity generation. Since the electronic timepiece 100 is reduced in weight, portability improves, and moreover, a user of the electronic timepiece 100 does not get tired even if he/she fits the timepiece on his/her wrist for a long time.

Since it is unnecessary to adopt a white-base timepiece dial to take in reflected lights from the timepiece dial, and various-colored timepiece dials can be adopted, improvement in decorative appeal can be achieved.

A disc-like solar battery disposed below the timepiece dial is restricted to a black-base timepiece dial that can generate a high power source voltage and is excellent in optical transparency to incident lights. In the electronic timepiece 100, however, since the oscillating unit 601 can be started with a low starting voltage lower than the power source voltage of the electricity-generating unit 101, the electronic timepiece 100 can be actuated sufficiently even if a light receiving efficiency is lowered. Accordingly, since it is unnecessary to restrict the timepiece dial to a black base one and various-colored timepiece dial can be adopted, improvement in decorative appeal can be achieved.

Since the boosting unit 103 is driven directly by the oscillating unit 601 and the waveform shaping unit 603 with a boosting clock Sa having the same frequency as the oscillating frequency just after oscillation start, a load such as a stepping motor with a rated voltage higher than the starting voltage of the oscillating unit 601 itself can be activated instantaneously.

Since overtone oscillation can also be suppressed by using a constant current circuit for supplying power to the oscillating unit 601, and power consumption during oscillation can be reduced as compared with the conventional one, improvement in actuation characteristic of the electronic timepiece 100 can be achieved while stable oscillation characteristic is being maintained.

In the electronic timepiece 100, especially, the crystal oscillator 611 used for an oscillating circuit in an ordinary electronic timepiece is used but another oscillating circuit whose consumption current is large, such as a CR oscillating circuit or a ring oscillating circuit is not used. Accordingly, a current required for oscillating behavior can be reduced significantly, and oscillation actuation can be facilitated and smooth actuation of the electronic timepiece 100 can be performed.

Thereby, a thermoelectric generator with a high output resistance value or the like can be adopted as the electricity-generating unit 101. It is unnecessary to separately prepare a oscillating circuit whose consumption current is large, such as a CR oscillating circuit or a ring oscillating circuit, so that the number of parts can be reduced. Size reduction of the electronic timepiece 100 can be achieved owing to the reduction in number of parts, and improvement in flexibility in layout or design for a small electronic timepiece such as an electronic timepiece for a woman can be achieved.

Circuit elements constituting the electronic timepiece 100 in the embodiment described above are not limited to these members. For example, the second diode 122 for supplying power from the storage unit 102 to the timepiece block 104 is used to simplify a route for charging/discharging control on the storage unit 102, but a switch constituted of a MOSFET may be used instead of the second diode. Similarly, the first diode 121 may be a switch constituted of a MOSFET. Although it is assumed that connecting states of capacitors are switched in the boosting unit 103, an induction voltage occurring in a coil may be utilized in the boosting unit 103.

Even if the solar battery is reduced in size, power sufficient for actuating the electronic timepiece 100 can be obtained, so that size reduction of the electronic timepiece 100 and improvement in flexibility of design can be achieved. Especially, the present invention can be applied to an electronic timepiece for a woman whose size reduction is required.

In the embodiment described above, the electronic timepiece 100 that generates power using the solar battery as the electricity-generating unit 101 has been explained. Besides, however, the present invention may be applied to an electronic timepiece of a temperature difference electricity-generating type where a plurality of thermocouples that generates thermal energy utilizing heat of a human body are serialized and power is generated utilizing temperature differences between both ends of the thermocouples, or may be adopted to an electronic timepiece of a mechanical electricity-generating type where mechanical energy obtained by vibrations of a rotary weight is converted to electric energy to generate power.

Various devices except for the electronic timepiece 100 can be driven using a power generator whose generation voltage is low. The devices except for the electronic timepiece 100 include a portable type electronic device, for example, a portable phone, a Personal Digital Assistance (PDA), or a portable-type radio set (for example, a card-type radio set). In that case, the timing unit 605 shown in FIG. 1 is replaced by an activating unit that performs activation inherent to its electronic device, so that actuation of the electronic device can be performed according to oscillation output from the oscillating unit 601 that has started with a low voltage.

As explained above, according to the invention, a power source voltage can be boosted up to an activation voltage required for activating an electronic timepiece or an electric device, when a power source voltage lower than the activation voltage is applied to the electronic timepiece or the electric device. Accordingly, even when a power source voltage generated by converting external energy obtained from sun light, illumination light, or heat of a human body or vibrations, to electric energy is lower than an activation voltage, such an advantage can be obtained that an electronic timepiece or an electronic device can be actuated reliably.

Even if a power source voltage generated is lower than an activation voltage, actuation can be made sufficiently, so that a power source voltage generating unit that converts external energy to electric energy, for example, a solar battery, a thermocouple or rotary weight can be reduced in size as far as a power source voltage can be generated. Therefore, size reduction of an electronic timepiece or an electronic device can be achieved.

In particular, even if a small-sized solar battery, thermocouple, or rotary weight where a generated voltage is a power source voltage or so is mounted, actuation can be made sufficiently. Therefore, the present invention can be also applied to an electronic timepiece for a woman smaller than an electronic timepiece for a man. Since it is unnecessary to provide a large-sized solar battery, thermocouple, or rotary weight that generates an activation voltage, a small-sized electronic timepiece for a woman with a fine decoration can be generated.

INDUSTRIAL APPLICABILITY

As described above, the present invention can be applied to an electronic device provided with a electricity-generating function that converts external energy to electric energy, such as an electronic timepiece, a portable phone, a PDA, or portable type radio set.

The invention claimed is:

1. An electronic timepiece comprises:
   a power-source voltage generating unit that converts external energy to electric energy and generates a power source voltage lower than a predetermined operating voltage;
   an oscillation-signal output unit that outputs an oscillation signal when the power source voltage generated is applied to the oscillation-signal output unit;
   a boosting unit that boosts up the power source voltage generated to at least the predetermined operating voltage;
   a boosting control unit that controls the boosting unit to boost up the power source voltage only for a predetermined time after the oscillation signal output unit starts to operate, based upon the oscillation signal; and
   a timing unit that times when the predetermined operating voltage boosted by the boosting control unit is applied to the timing unit.

2. The electronic timepiece according to claim 1, further comprising
   a frequency-dividing unit that frequency-divides the oscillation signal and outputs a frequency-dividing signal; and
   a boosting-stop-instruction-signal output unit that outputs a boosting stop instruction signal, for stopping an boosting behavior performed by the boosting unit, based upon the frequency-dividing signal when the predetermined time elapses after the oscillation-signal output unit outputs the oscUlation signal, wherein
   the boosting control unit stops the boosting behavior based upon the boosting stop instruction signal.

3. The electronic timepiece according to claim 1, further comprising
   a boosting-stop-instruction-signal output unit that outputs a boosting stop instruction signal, for stopping a boosting behavior performed by the boosting unit, when the predetermined time elapses, wherein
   the boosting behavior is stopped based upon the boosting stop instruction signal.

4. The electronic timepiece according to claim 1, wherein the boosting control unit includes
   a time-information input unit that inputs time information representing one of a plurality of the predetermined times, time intervals of the predetermined times being different from one another;

a time-information storage unit that stores the time information inputted;

a time-information extracting unit that extracts the time information stored, when the power source voltage generated by the power-source voltage generating unit is applied to the time-information extracting unit; and a boosting-stop-instruction-signal generating unit that generates a boosting stop instruction signal, for stopping a boosting behavior performed by the boosting unit, based upon the time information extracted, when a predetermined time indicated by the time information extracted elapses, wherein the boosting behavior is stopped based upon the boosting stop instruction signal.

5. The electronic timepiece according to claim 1, wherein the oscillation-signal output unit includes a constant current circuit that feeds a constant current;

an oscillation inverter that reverses and amplifies an input to the oscillation inverter and outputs the oscillation signal, when the constant current circuit supplies a constant current to the oscillation inverter, and has an input terminal and an output terminal;

a resonating circuit that are connected between the input terminal of the oscillation inverter and the output terminal of the oscillation inverter, and resonates.

6. The electronic timepiece according to claim 5, wherein the timing unit includes a logic circuit that has a plurality of field effect transistors, and the oscillation inverter includes a field effect transistor that has a threshold voltage lower than a threshold voltage of each of the field effect transistors of the timing unit.

7. The electronic timepiece according to claim 5, wherein the timing unit includes a logic circuit that has a plurality of field effect transistors, and the electronic timepiece further comprises a waveform shaping unit includes a field effect transistor that has a threshold voltage lower than a threshold voltage of each of the field effect transistors of the timing unit, shapes a waveform of the oscillation signal outputted from the oscillation-signal output unit, and outputs an oscillation signal that has the waveform shaped to the timing unit.

8. The electronic timepiece according to claim 5, wherein the timing unit includes a logic circuit that has a plurality of field effect transistors, and the boosting control unit includes a field effect transistor that has a threshold voltage lower than a threshold voltage of each of the field effect transistors of the timing unit.

9. The electronic timepiece according to claim 5, further comprising a bias circuit that includes a field effect transistor that has a threshold that is same as a threshold of the oscillation inverter, and that applies a predetermined bias voltage to the oscillation inverter.

10. The electronic timepiece according to claim 5, further comprising a waveform shaping unit that shapes a waveform of the oscillation signal outputted from the oscillation-signal output unit, and output an oscillation signal that has the waveform shaped to the timing unit, and a bias circuit that includes a field effect transistor that has a threshold that is same as a threshold of the waveform shaping unit, and that applies a predetermined bias voltage to the waveform shaping unit.

11. An electronic timepiece comprises:

a power-source voltage generating unit that converts external energy to electric energy and generates a power source voltage lower than a predetermined operating voltage;

an oscillation-signal output unit that outputs an oscillation signal when the power source voltage generated is applied to the oscillation-signal output unit;

a boosting unit that boosts up the power source voltage generated to at least the predetermined operating voltage;

a power-source voltage detecting unit that detects whether the power source voltage is boosted up to the predetermined operating voltage by the boosting unit;

a boosting control unit that controls the boosting unit, and boosts up the power source voltage after the oscillation signal output unit starts to operate till the power source voltage detecting unit detects the predetermined power source voltage; and a timing unit that times when the predetermined operating voltage is applied to the timing unit based on the oscillation signal.

12. The electronic timepiece according to claim 11, wherein the boosting control unit controls the boosting behavior performed by the boosting unit based upon the oscillation signal and the detection result, when a predetermined time elapses after the oscillation-signal output unit outputs the oscillation signal.

13. The electronic timepiece according to claim 11, wherein the oscillation-signal output unit includes a constant current circuit that feeds a constant current;

an oscillation inverter that reverses and amplifies an input to the oscillation inverter and outputs the oscillation signal, when the constant current circuit supplies a constant current to the oscillation inverter, and has an input terminal and an output terminal;

a resonating circuit that are connected between the input terminal of the oscillation inverter and the output terminal of the oscillation inverter, and resonates.

14. The electronic timepiece according to claim 13, wherein the timing unit includes a logic circuit that has a plurality of field effect transistors, and the oscillation inverter includes a field effect transistor that has a threshold voltage lower than a threshold voltage of each of the field effect transistors of the timing unit.

15. The electronic timepiece according to claim 13, wherein the timing unit includes a logic circuit that has a plurality of field effect transistors, and the electronic timepiece further comprises a waveform shaping unit includes a field effect transistor that has a threshold voltage lower than a threshold voltage of each of the field effect transistors of the timing unit, shapes a waveform of the oscillation signal outputted from the oscillation-signal output unit, and outputs an oscillation signal that has the waveform shaped to the timing unit.

16. The electronic timepiece according to claim 13, wherein the timing unit includes a logic circuit that has a plurality of field effect transistors, and the boosting control unit includes a field effect transistor that has a threshold voltage lower than a threshold voltage of each of the field effect transistors of the timing unit.

17. The electronic timepiece according to claim 13, further comprising a bias circuit that includes a field effect transistor that has a threshold that is same as a threshold of the oscillation inverter, and that applies a predetermined bias voltage to the oscillation inverter.

18. The electronic timepiece according to claim 13, further comprising a waveform shaping unit that shapes a waveform of the oscillation signal outputted from the oscillation-signal output unit, and output an oscillation signal that has the waveform shaped to the timing unit, and a bias circuit that includes a field effect transistor that has a threshold that is same as a threshold of the waveform shaping unit, and that applies a predetermined bias voltage to the waveform shaping unit.

* * * * *